US 9,202,548 B2

(12) United States Patent
Faber

(10) Patent No.: US 9,202,548 B2
(45) Date of Patent: Dec. 1, 2015

(54) EFFICIENT PCMS REFRESH MECHANISM

(75) Inventor: Robert W. Faber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 13/997,661

(22) PCT Filed: Dec. 22, 2011

(86) PCT No.: PCT/US2011/066945
§ 371 (c)(1),
(2), (4) Date: Jun. 24, 2013

(87) PCT Pub. No.: WO2013/095530
PCT Pub. Date: Jun. 27, 2013

(65) Prior Publication Data
US 2014/0204663 A1     Jul. 24, 2014

(51) Int. Cl.
| G11C 11/00 | (2006.01) |
| G11C 11/406 | (2006.01) |
| G11C 13/00 | (2006.01) |
| G11C 16/34 | (2006.01) |

(52) U.S. Cl.
CPC ........ *G11C 11/406* (2013.01); *G11C 11/40618* (2013.01); *G11C 13/0004* (2013.01); *G11C 13/004* (2013.01); *G11C 13/0033* (2013.01); *G11C 13/0069* (2013.01); *G11C 16/3418* (2013.01); *G11C 2013/0057* (2013.01); *G11C 2211/5647* (2013.01)

(58) Field of Classification Search
CPC ............. G11C 13/0069; G11C 13/004; G11C 11/5678; G11C 11/406; G11C 7/1006; G11C 11/4091; G11C 11/40618; G11C 11/40607

USPC ......... 365/163, 222, 189.14–189.16; 711/105
See application file for complete search history.

(56) References Cited

U.S. PATENT DOCUMENTS

| 5,912,839 A | 6/1999 | Ovshinsky et al. |
| 6,922,350 B2 | 7/2005 | Coulson et al. |
| 7,168,026 B2 | 1/2007 | Garney et al. |
| 7,286,387 B2 | 10/2007 | Coulson et al. |
| 7,516,267 B2 | 4/2009 | Coulson et al. |
| 7,590,918 B2 | 9/2009 | Parkinson |
| 7,719,878 B2 | 5/2010 | Coulson et al. |
| 7,797,479 B2 | 9/2010 | Trika et al. |
| 7,941,692 B2 | 5/2011 | Royer et al. |
| 8,228,721 B2 * | 7/2012 | Lung ............................. 365/163 |
| 8,463,948 B1 | 6/2013 | Qawami et al. |
| 8,607,089 B2 | 12/2013 | Qawami et al. |
| 8,612,666 B2 | 12/2013 | Royer et al. |

(Continued)

OTHER PUBLICATIONS

Lee et al., "Architecting Phase Change Memory as a Scalable DRAM Alternative", ISCA '09, Jun. 20, 2009, 12 pgs., Austin, Texas, USA.

(Continued)

*Primary Examiner* — David Lam
(74) *Attorney, Agent, or Firm* — Blakely, Sokoloff, Taylor & Zafman LLP

(57) ABSTRACT

An apparatus is described having invert determination logic circuitry to determine if a read data path that transports data read from a PCMS memory device is to be inverted or not inverted as a function of whether information represented by the data was last written in an inverted or non inverted logical state to the PCMS memory device during a refresh of said PCMS memory device.

22 Claims, 23 Drawing Sheets

(56) References Cited

U.S. PATENT DOCUMENTS

| | | |
|---|---|---|
| 8,838,935 B2 | 9/2014 | Hinton et al. |
| 2005/0114588 A1 | 5/2005 | Lucker et al. |
| 2006/0277367 A1 | 12/2006 | Faber |
| 2008/0219047 A1 | 9/2008 | Yu et al. |
| 2008/0270811 A1 | 10/2008 | Chow et al. |
| 2009/0327837 A1 | 12/2009 | Royer et al. |
| 2010/0103726 A1 | 4/2010 | Bae et al. |
| 2010/0165722 A1 | 7/2010 | Sheu et al. |
| 2010/0291867 A1 | 11/2010 | Abdulla et al. |
| 2010/0293317 A1 | 11/2010 | Confalonieri et al. |
| 2010/0306446 A1 | 12/2010 | Villa et al. |
| 2010/0306453 A1 | 12/2010 | Doller |
| 2010/0318718 A1 | 12/2010 | Eilert et al. |
| 2011/0103159 A1 | 5/2011 | Noorlag et al. |
| 2013/0268725 A1 | 10/2013 | Faber |
| 2013/0290597 A1 | 10/2013 | Faber |
| 2014/0317337 A1 | 10/2014 | Puthiyedath et al. |

OTHER PUBLICATIONS

Condit et al., "Better I/O Through Byte-Addressable, Persistent Memory", SOSP '09, Oct. 11, 2009, pp. 133-146. Big Sky, Montana, USA.
Freitas et al., "Storage-class memory: The next storage system technology", IBM J. Res. & Dev., Jul./Sep. 2008, pp. 439-447, vol. 52, No. 4/5.
Akel et al., "Onyx: A Prototype Phase Change Memory Storage Array",www.flashmemorysummit.com/ . . . /Proceeding_2011/08/11_S301_Akel.pdf, 5 pgs.
Mearian, "IBM announces computer memory breakthrough Phase-change memory offers 100 times the write performance of NAND flash", Jun. 30, 2011, 3 pgs.
Caulfield et al., "Moneta: A High-performance Storage Array Architecture for Next-generation, Non-volatile Memories", MICRO 43: Proceedings of the 43rd Annual IEEE/ACM International Symposium on Microarchitecture, Atlanta, GA Dec. 2010 pp. 385-395.
"The Non-Volatile Systems Laboratory Coding for non-volatile memories", http://nvsl.ucsd.edu/ecc, printed Sep. 1, 2011. 2 pgs.
"Phase change memory-based 'moneta' system points to the future of computer storage", ScienceBlog, Jun. 2, 2011, 7 pgs.
Quereshi et al., "Scalable High Performance Main Memory System Using Phase-Change Memory Technology", ISCA '09, Jun. 20, 2009, 10 pgs., Austin, Texas, USA.
Bailey et al., "Operating System Implications of Fast, Cheap, Non-Volatile Memory" 13th USENIX, HOTOS11 2011, May 9-11, 2011, 5 pgs.
Raoux et al., "Phase-change random access memory: A scalable technology", IBM J. Res. & Dev., Jul./Sep. 2008, pp. 465-479, vol. 52, No. 4/5.
Chen et al., "Rethinking Database Algorithms for Phase Change Memory", 5th Biennial Conference on Innovative Data Systems Research (CIDR '11), Jan. 9, 2011, 11 pgs., Asilomar, California, USA.
Jacob et al., "The Memory System You Can't Avoid It, You Can't Ignore It, You Can't Fake It", 2009, 77 pgs., Morgan & Claypool.
Mogul et al., "Operating System Support for NVM+DRAM Hybrid Main Memory", 12th Workshop on Hot Topics in Operating Systems (HatOS XII), May 18, 2009, 9 pgs.
PCT International Search Report for PCT Counterpart Application No. PCT/US2011/066945, 3 pgs., (Sep. 12, 2012).
PCT Written Opinion of the International Searching Authority for PCT Counterpart Application No. PCT/US2011/066945, 3 pgs., (Sep. 12, 2012).
PCT Notification concerning Transmittal of International Preliminary Report on Patentability (Chapter I of the Patent Cooperation Treaty) for PCT Counterpart Application No. PCT/US2011/066945, 5 pgs., (Jul. 3, 2014).
"The Non-Volatile Systems Laboratory NV-Heaps: Fast and Safe Persistent Objects", http://nvsl.ucsd.edu/nvuheaps/, 2 pgs., Sep. 1, 2011.
Kant, Dr. Krishna, "Exploiting NVRAM for Building Multi-Level Memory Systems", International Workshop on Operating System Technologies for Large Scale NVRAM, Oct. 21, 2008, Jeju, Korea, 19 pages.
"The Non-Volatile Systems Laboratory Moneta and Onyx: Very Fast SS", http://nvsl.ucsd.edu/moneta/, 3 pgs., Sep. 1, 2011.

* cited by examiner

EFFICIENT PCMS REFRESH MECHANISM

CROSS-REFERENCE TO RELATED APPLICATION

This patent application is a U.S. National Phase Application under 35 U.S.C. §371 of International Application No. PCT/US2011/066945, filed Dec. 22, 2011.

BACKGROUND

1. Field of the Invention

This invention relates generally to the field of computer systems. More particularly, the invention relates to an apparatus and method for implementing a multi-level memory hierarchy including a non-volatile memory tier.

2. Description of the Related Art

A. Current Memory and Storage Configurations

One of the limiting factors for computer innovation today is memory and storage technology. In conventional computer systems, system memory (also known as main memory, primary memory, executable memory) is typically implemented by dynamic random access memory (DRAM). DRAM-based memory consumes power even when no memory reads or writes occur because it must constantly recharge internal capacitors. DRAM-based memory is volatile, which means data stored in DRAM memory is lost once the power is removed. Conventional computer systems also rely on multiple levels of caching to improve performance. A cache is a high speed memory positioned between the processor and system memory to service memory access requests faster than they could be serviced from system memory. Such caches are typically implemented with static random access memory (SRAM). Cache management protocols may be used to ensure that the most frequently accessed data and instructions are stored within one of the levels of cache, thereby reducing the number of memory access transactions and improving performance.

With respect to mass storage (also known as secondary storage or disk storage), conventional mass storage devices typically include magnetic media (e.g., hard disk drives), optical media (e.g., compact disc (CD) drive, digital versatile disc (DVD), etc.), holographic media, and/or mass-storage flash memory (e.g., solid state drives (SSDs), removable flash drives, etc.). Generally, these storage devices are considered Input/Output (I/O) devices because they are accessed by the processor through various I/O adapters that implement various I/O protocols. These I/O adapters and I/O protocols consume a significant amount of power and can have a significant impact on the die area and the form factor of the platform. Portable or mobile devices (e.g., laptops, netbooks, tablet computers, personal digital assistant (PDAs), portable media players, portable gaming devices, digital cameras, mobile phones, smartphones, feature phones, etc.) that have limited battery life when not connected to a permanent power supply may include removable mass storage devices (e.g., Embedded Multimedia Card (eMMC), Secure Digital (SD) card) that are typically coupled to the processor via low-power interconnects and I/O controllers in order to meet active and idle power budgets.

With respect to firmware memory (such as boot memory (also known as BIOS flash)), a conventional computer system typically uses flash memory devices to store persistent system information that is read often but seldom (or never) written to. For example, the initial instructions executed by a processor to initialize key system components during a boot process (Basic Input and Output System (BIOS) images) are typically stored in a flash memory device. Flash memory devices that are currently available in the market generally have limited speed (e.g., 50 MHz). This speed is further reduced by the overhead for read protocols (e.g., 2.5 MHz). In order to speed up the BIOS execution speed, conventional processors generally cache a portion of BIOS code during the Pre-Extensible Firmware Interface (PEI) phase of the boot process. The size of the processor cache places a restriction on the size of the BIOS code used in the PEI phase (also known as the "PEI BIOS code").

B. Phase-Change Memory (PCM) and Related Technologies

Phase-change memory (PCM), also sometimes referred to as phase change random access memory (PRAM or PCRAM), PCME, Ovonic Unified Memory, or Chalcogenide RAM (C-RAM), is a type of non-volatile computer memory which exploits the unique behavior of chalcogenide glass. As a result of heat produced by the passage of an electric current, chalcogenide glass can be switched between two states: crystalline and amorphous. Recent versions of PCM can achieve two additional distinct states.

PCM provides higher performance than flash because the memory element of PCM can be switched more quickly, writing (changing individual bits to either 1 or 0) can be done without the need to first erase an entire block of cells, and degradation from writes is slower (a PCM device may survive approximately 100 million write cycles; PCM degradation is due to thermal expansion during programming, metal (and other material) migration, and other mechanisms).

BRIEF DESCRIPTION OF THE DRAWINGS

The following description and accompanying drawings are used to illustrate embodiments of the invention. In the drawings.

DETAILED DESCRIPTION

Figure 1:
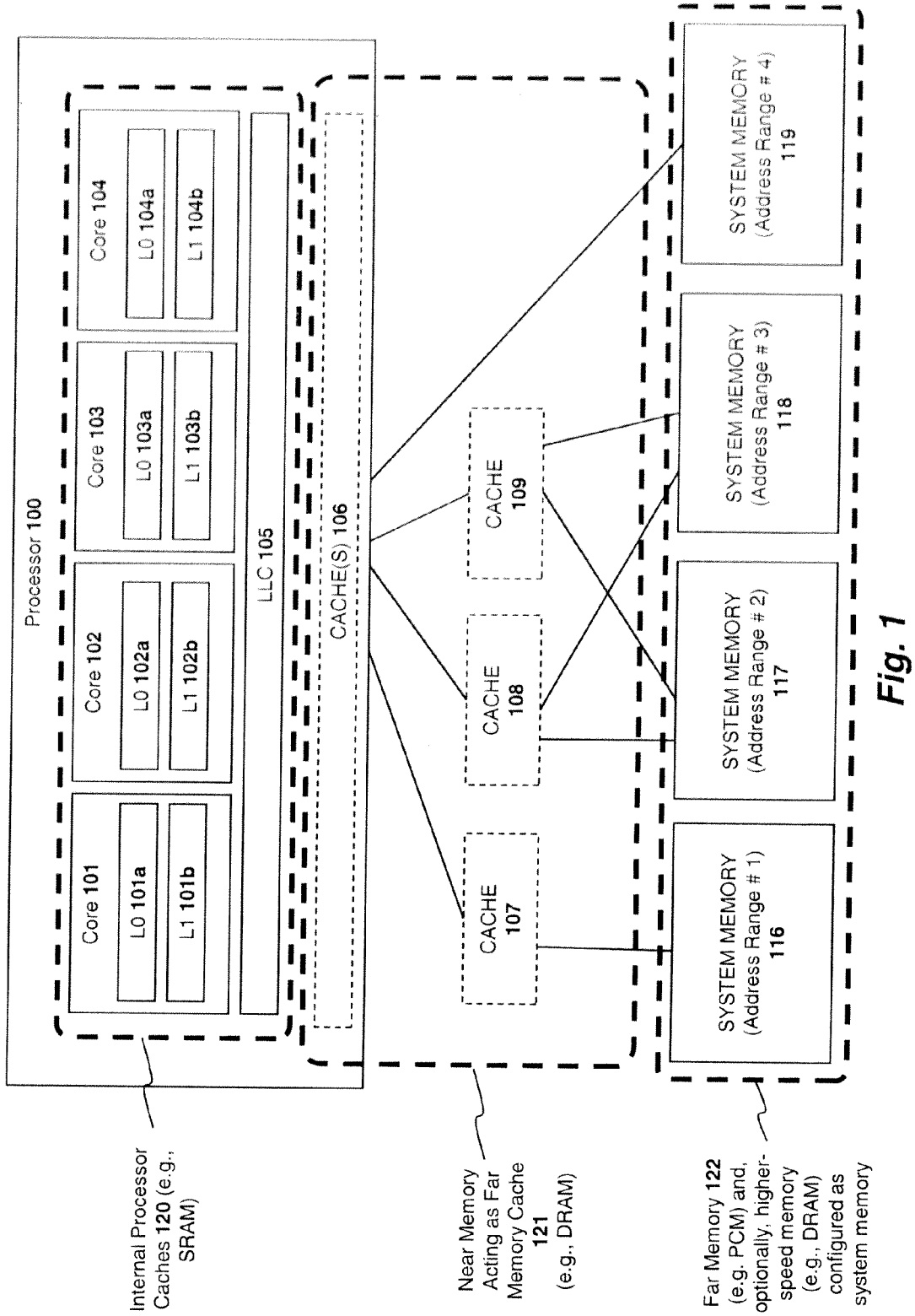
FIG. 1 illustrates a cache and system memory arrangement according to embodiments of the invention.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Bracketed text and blocks with dashed borders (e.g., large dashes, small dashes, dot-dash, dots) are sometimes used herein to illustrate optional operations/components that add additional features to embodiments of the invention. However, such notation should not be taken to mean that these are the only options or optional operations/components, and/or that blocks with solid borders are not optional in certain embodiments of the invention.

INTRODUCTION

Memory capacity and performance requirements continue to increase with an increasing number of processor cores and new usage models such as virtualization. In addition, memory power and cost have become a significant component of the overall power and cost, respectively, of electronic systems.

Some embodiments of the invention solve the above challenges by intelligently subdividing the performance requirement and the capacity requirement between memory technologies. The focus of this approach is on providing performance with a relatively small amount of a relatively higher-speed memory such as DRAM while implementing the bulk of the system memory using significantly cheaper and denser non-volatile random access memory (NVRAM). Embodiments of the invention described below define platform configurations that enable hierarchical memory subsystem organizations for the use of NVRAM. The use of NVRAM in the memory hierarchy also enables new usages such as expanded boot space and mass storage implementations, as described in detail below.

FIG. 1 illustrates a cache and system memory arrangement according to embodiments of the invention. Specifically, FIG. 1 shows a memory hierarchy including a set of internal processor caches 120, "near memory" acting as a far memory cache 121, which may include both internal cache(s) 106 and external caches 107-109, and "far memory" 122. One particular type of memory which may be used for "far memory" in some embodiments of the invention is non-volatile random access memory ("NVRAM"). As such, an overview of NVRAM is provided below, followed by an overview of far memory and near memory.

A. Non-Volatile Random Access Memory ("NVRAM")

There are many possible technology choices for NVRAM, including PCM, Phase Change Memory and Switch (PCMS) (the latter being a more specific implementation of the former), byte-addressable persistent memory (BPRAM), storage class memory (SCM), universal memory, Ge2Sb2Te5, programmable metallization cell (PMC), resistive memory (RRAM), RESET (amorphous) cell, SET (crystalline) cell, PCME, Ovshinsky memory, ferroelectric memory (also known as polymer memory and poly(N-vinylcarbazole)), ferromagnetic memory (also known as Spintronics, SPRAM (spin-transfer torque RAM), STRAM (spin tunneling RAM), magnetoresistive memory, magnetic memory, magnetic random access memory (MRAM)), and Semiconductor-oxide-nitride-oxide-semiconductor (SONOS, also known as dielectric memory).

NVRAM has the following characteristics:

(1) It maintains its content even if power is removed, similar to FLASH memory used in solid state disks (SSD), and different from SRAM and DRAM which are volatile;

(2) lower power consumption than volatile memories such as SRAM and DRAM;

(3) random access similar to SRAM and DRAM (also known as randomly addressable);

(4) rewritable and erasable at a lower level of granularity (e.g., byte level) than FLASH found in SSDs (which can only be rewritten and erased a "block" at a time—minimally 64 Kbyte in size for NOR FLASH and 16 Kbyte for NAND FLASH);

(5) used as a system memory and allocated all or a portion of the system memory address space;

(6) capable of being coupled to the processor over a bus using a transactional protocol (a protocol that supports transaction identifiers (IDs) to distinguish different transactions so that those transactions can complete out-of-order) and allowing access at a level of granularity small enough to support operation of the NVRAM as system memory (e.g., cache line size such as 64 or 128 byte). For example, the bus may be a memory bus (e.g., a DDR bus such as DDR3, DDR4, etc.) over which is run a transactional protocol as opposed to the non-transactional protocol that is normally used. As another example, the bus may one over which is normally run a transactional protocol (a native transactional protocol), such as a PCI express (PCIE) bus, desktop management interface (DMI) bus, or any other type of bus utilizing a transactional protocol and a small enough transaction payload size (e.g., cache line size such as 64 or 128 byte); and (7) one or more of the following:
  a) faster write speed than non-volatile memory/storage technologies such as FLASH;
  b) very high read speed (faster than FLASH and near or equivalent to DRAM read speeds);
  c) directly writable (rather than requiring erasing (overwriting with 1s) before writing data like FLASH memory used in SSDs);
  d) a greater number of writes before failure (more than boot ROM and FLASH used in SSDs); and/or As mentioned above, in contrast to FLASH memory, which must be rewritten and erased a complete "block" at a time, the level of granularity at which NVRAM is accessed in any given implementation may depend on the particular memory controller and the particular memory bus or other type of bus to which the NVRAM is coupled. For example, in some implementations where NVRAM is used as system memory, the NVRAM may be accessed at the granularity of a cache line (e.g., a 64-byte or 128-Byte cache line), notwithstanding an inherent ability to be accessed at the granularity of a byte, because cache line is the level at which the memory subsystem accesses memory. Thus, when NVRAM is deployed within a memory subsystem, it may be accessed at the same level of granularity as the DRAM (e.g., the "near memory") used in the same memory subsystem. Even so, the level of granularity of access to the NVRAM by the memory controller and memory bus or other type of bus is smaller than that of the block size used by Flash and the access size of the I/O subsystem's controller and bus.

NVRAM may also incorporate wear leveling algorithms to account for the fact that the storage cells at the far memory level begin to wear out after a number of write accesses, especially where a significant number of writes may occur such as in a system memory implementation. Since high cycle count blocks are most likely to wear out in this manner, wear leveling spreads writes across the far memory cells by swapping addresses of high cycle count blocks with low cycle count blocks. Note that most address swapping is typically transparent to application programs because it is handled by hardware, lower-level software (e.g., a low level driver or operating system), or a combination of the two.

B. Far Memory

The far memory 122 of some embodiments of the invention is implemented with NVRAM, but is not necessarily limited to any particular memory technology. Far memory 122 is distinguishable from other instruction and data memory/storage technologies in terms of its characteristics and/or its application in the memory/storage hierarchy. For example, far memory 122 is different from:

1) static random access memory (SRAM) which may be used for level 0 and level 1 internal processor caches 101a-b, 102a-b, 103a-b, 103a-b, and 104a-b dedicated to each of the processor cores 101-104, respectively, and lower level cache (LLC) 105 shared by the processor cores;
2) dynamic random access memory (DRAM) configured as a cache 106 internal to the processor 100 (e.g., on the same die as the processor 100) and/or configured as one or more caches 107-109 external to the processor (e.g., in the same or a different package from the processor 100); and
3) FLASH memory/magnetic disk/optical disc applied as mass storage (not shown); and
4) memory such as FLASH memory or other read only memory (ROM) applied as firmware memory (which can refer to boot ROM, BIOS Flash, and/or TPM Flash). (not shown).

Far memory 122 may be used as instruction and data storage that is directly addressable by a processor 100 and is able to sufficiently keep pace with the processor 100 in contrast to FLASH/magnetic disk/optical disc applied as mass storage. Moreover, as discussed above and described in detail below, far memory 122 may be placed on a memory bus and may communicate directly with a memory controller that, in turn, communicates directly with the processor 100.

Far memory 122 may be combined with other instruction and data storage technologies (e.g., DRAM) to form hybrid memories (also known as Co-locating PCM and DRAM; first level memory and second level memory; FLAM (FLASH and DRAM)). Note that at least some of the above technologies, including PCM/PCMS may be used for mass storage instead of, or in addition to, system memory, and need not be random accessible, byte addressable or directly addressable by the processor when applied in this manner.

For convenience of explanation, most of the remainder of the application will refer to "NVRAM" or, more specifically, "PCM," or "PCMS" as the technology selection for the far memory 122. As such, the terms NVRAM, PCM, PCMS, and far memory may be used interchangeably in the following discussion. However it should be realized, as discussed above, that different technologies may also be utilized for far memory. Also, that NVRAM is not limited for use as far memory.

C. Near Memory

"Near memory" 121 is an intermediate level of memory configured in front of a far memory 122 that has lower read/write access latency relative to far memory and/or more symmetric read/write access latency (i.e., having read times which are roughly equivalent to write times). In some embodiments, the near memory 121 has significantly lower write latency than the far memory 122 but similar (e.g., slightly lower or equal) read latency; for instance the near memory 121 may be a volatile memory such as volatile random access memory (VRAM) and may comprise a DRAM or other high speed capacitor-based memory. Note, however, that the underlying principles of the invention are not limited to these specific memory types. Additionally, the near memory 121 may have a relatively lower density and/or may be more expensive to manufacture than the far memory 122.

In one embodiment, near memory 121 is configured between the far memory 122 and the internal processor caches 120. In some of the embodiments described below, near memory 121 is configured as one or more memory-side caches (MSCs) 107-109 to mask the performance and/or usage limitations of the far memory including, for example, read/write latency limitations and memory degradation limitations. In these implementations, the combination of the MSC 107-109 and far memory 122 operates at a performance level which approximates, is equivalent or exceeds a system which uses only DRAM as system memory. As discussed in detail below, although shown as a "cache" in FIG. 1, the near memory 121 may include modes in which it performs other roles, either in addition to, or in lieu of, performing the role of a cache.

Near memory 121 can be located on the processor die (as cache(s) 106) and/or located external to the processor die (as caches 107-109) (e.g., on a separate die located on the CPU package, located outside the CPU package with a high bandwidth link to the CPU package, for example, on a memory dual in-line memory module (DIMM), a riser/mezzanine, or a computer motherboard). The near memory 121 may be coupled in communicate with the processor 100 using a single or multiple high bandwidth links, such as DDR or other transactional high bandwidth links (as described in detail below).

An Exemplary System Memory Allocation Scheme

FIG. 1 illustrates how various levels of caches 101-109 are configured with respect to a system physical address (SPA) space 116-119 in embodiments of the invention. As mentioned, this embodiment comprises a processor 100 having one or more cores 101-104, with each core having its own dedicated upper level cache (L0) 101*a*-104*a* and mid-level cache (MLC) (L1) cache 101*b*-104*b*. The processor 100 also includes a shared LLC 105. The operation of these various cache levels are well understood and will not be described in detail here.

The caches 107-109 illustrated in FIG. 1 may be dedicated to a particular system memory address range or a set of non-contiguous address ranges. For example, cache 107 is dedicated to acting as an MSC for system memory address range #1 116 and caches 108 and 109 are dedicated to acting as MSCs for non-overlapping portions of system memory address ranges #2 117 and #3 118. The latter implementation may be used for systems in which the SPA space used by the processor 100 is interleaved into an address space used by the caches 107-109 (e.g., when configured as MSCs). In some embodiments, this latter address space is referred to as a memory channel address (MCA) space. In one embodiment, the internal caches 101*a*-106 perform caching operations for the entire SPA space.

System memory as used herein is memory which is visible to and/or directly addressable by software executed on the processor 100; while the cache memories 101*a*-109 may operate transparently to the software in the sense that they do not form a directly-addressable portion of the system address space, but the cores may also support execution of instructions to allow software to provide some control (configuration, policies, hints, etc.) to some or all of the cache(s). The subdivision of system memory into regions 116-119 may be performed manually as part of a system configuration process (e.g., by a system designer) and/or may be performed automatically by software.

In one embodiment, the system memory regions 116-119 are implemented using far memory (e.g., PCM) and, in some embodiments, near memory configured as system memory. System memory address range #4 represents an address range which is implemented using a higher speed memory such as DRAM which may be a near memory configured in a system memory mode (as opposed to a caching mode).

Figure 2:
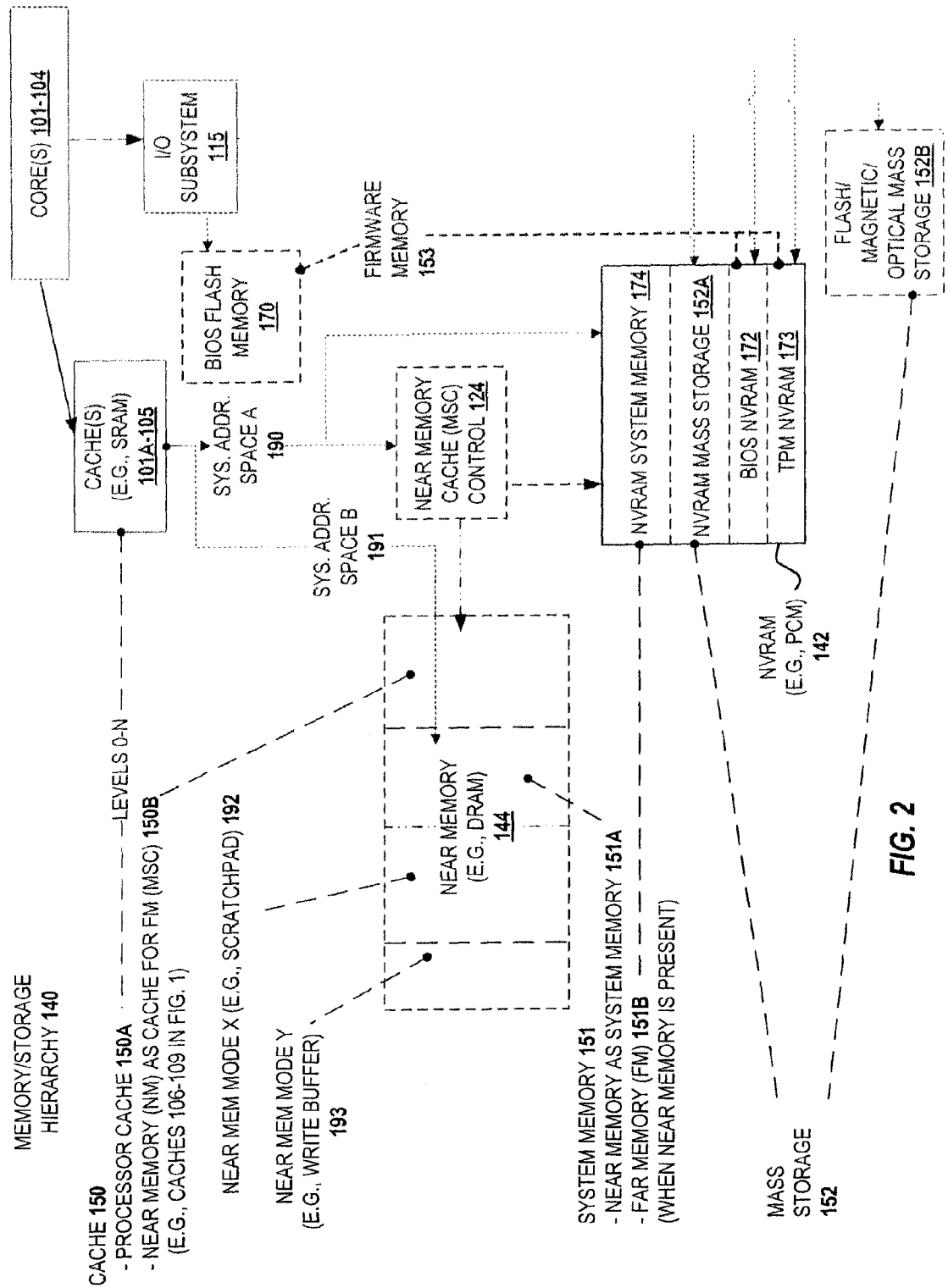
FIG. 2 illustrates a memory and storage hierarchy employed in embodiments of the invention.

FIG. 2 illustrates a memory/storage hierarchy 140 and different configurable modes of operation for near memory 144 and NVRAM according to embodiments of the invention. The memory/storage hierarchy 140 has multiple levels including (1) a cache level 150 which may include processor caches 150A (e.g., caches 101A-105 in FIG. 1) and optionally near memory as cache for far memory 150B (in certain modes of operation as described herein), (2) a system memory level 151 which may include far memory 151B (e.g., NVRAM such as PCM) when near memory is present (or just NVRAM as system memory 174 when near memory is not present), and optionally near memory operating as system memory 151A (in certain modes of operation as described herein), (3) a mass storage level 152 which may include a flash/magnetic/optical mass storage 152B and/or NVRAM mass storage 152A (e.g., a portion of the NVRAM 142); and (4) a firmware memory level 153 that may include BIOS flash 170 and/or BIOS NVRAM 172 and optionally trusted platform module (TPM) NVRAM 173.

As indicated, near memory 144 may be implemented to operate in a variety of different modes including: a first mode in which it operates as a cache for far memory (near memory as cache for FM 150B); a second mode in which it operates as system memory 151A and occupies a portion of the SPA space (sometimes referred to as near memory "direct access" mode); and one or more additional modes of operation such as a scratchpad memory 192 or as a write buffer 193. In some embodiments of the invention, the near memory is partitionable, where each partition may concurrently operate in a different one of the supported modes; and different embodiments may support configuration of the partitions (e.g., sizes, modes) by hardware (e.g., fuses, pins), firmware, and/or software (e.g., through a set of programmable range registers within the MSC controller 124 within which, for example, may be stored different binary codes to identify each mode and partition).

System address space A 190 in FIG. 2 is used to illustrate operation when near memory is configured as a MSC for far memory 150B. In this configuration, system address space A 190 represents the entire system address space (and system address space B 191 does not exist). Alternatively, system address space B 191 is used to show an implementation when all or a portion of near memory is assigned a portion of the system address space. In this embodiment, system address space B 191 represents the range of the system address space assigned to the near memory 151A and system address space A 190 represents the range of the system address space assigned to NVRAM 174.

In addition, when acting as a cache for far memory 150B, the near memory 144 may operate in various sub-modes under the control of the MSC controller 124. In each of these modes, the near memory address space (NMA) is transparent to software in the sense that the near memory does not form a directly-addressable portion of the system address space. These modes include but are not limited to the following:

(1) Write-Back Caching Mode:

In this mode, all or portions of the near memory acting as a FM cache 150B is used as a cache for the NVRAM far memory (FM) 151B. While in write-back mode, every write operation is directed initially to the near memory as cache for FM 150B (assuming that the cache line to which the write is directed is present in the cache). A corresponding write operation is performed to update the NVRAM FM 151B only when the cache line within the near memory as cache for FM 150B is to be replaced by another cache line (in contrast to write-through mode described below in which each write operation is immediately propagated to the NVRAM FM 151B).

(2) Near Memory Bypass Mode:

In this mode all reads and writes bypass the NM acting as a FM cache 150B and go directly to the NVRAM FM 151B. Such a mode may be used, for example, when an application is not cache friendly or requires data to be committed to persistence at the granularity of a cache line. In one embodiment, the caching performed by the processor caches 150A and the NM acting as a FM cache 150B operate independently of one another. Consequently, data may be cached in the NM acting as a FM cache 150B which is not cached in the processor caches 150A (and which, in some cases, may not be permitted to be cached in the processor caches 150A) and vice versa. Thus, certain data which may be designated as "uncacheable" in the processor caches may be cached within the NM acting as a FM cache 150B.

(3) Near Memory Read-Cache Write Bypass Mode:

This is a variation of the above mode where read caching of the persistent data from NVRAM FM 151B is allowed (i.e., the persistent data is cached in the near memory as cache for far memory 150B for read-only operations). This is useful when most of the persistent data is "Read-Only" and the application usage is cache-friendly.

(4) Near Memory Read-Cache Write-Through Mode:

This is a variation of the near memory read-cache write bypass mode, where in addition to read caching, write-hits are also cached. Every write to the near memory as cache for FM 150B causes a write to the FM 151B. Thus, due to the write-through nature of the cache, cache-line persistence is still guaranteed.

When acting in near memory direct access mode, all or portions of the near memory as system memory 151A are directly visible to software and form part of the SPA space. Such memory may be completely under software control. Such a scheme may create a non-uniform memory address (NUMA) memory domain for software where it gets higher performance from near memory 144 relative to NVRAM system memory 174. By way of example, and not limitation, such a usage may be employed for certain high performance computing (HPC) and graphics applications which require very fast access to certain data structures.

In an alternate embodiment, the near memory direct access mode is implemented by "pinning" certain cache lines in near memory (i.e., cache lines which have data that is also concurrently stored in NVRAM 142). Such pinning may be done effectively in larger, multi-way, set-associative caches.

FIG. 2 also illustrates that a portion of the NVRAM 142 may be used as firmware memory. For example, the BIOS NVRAM 172 portion may be used to store BIOS images (instead of or in addition to storing the BIOS information in BIOS flash 170). The BIOS NVRAM portion 172 may be a portion of the SPA space and is directly addressable by software executed on the processor cores 101-104, whereas the BIOS flash 170 is addressable through the I/O subsystem 115. As another example, a trusted platform module (TPM) NVRAM 173 portion may be used to protect sensitive system information (e.g., encryption keys).

Thus, as indicated, the NVRAM 142 may be implemented to operate in a variety of different modes, including as far memory 151B (e.g., when near memory 144 is present/operating, whether the near memory is acting as a cache for the FM via a MSC control 124 or not (accessed directly after cache(s) 101A-105 and without MSC control 124)); just NVRAM system memory 174 (not as far memory because there is no near memory present/operating; and accessed without MSC control 124); NVRAM mass storage 152A; BIOS NVRAM 172; and TPM NVRAM 173. While different embodiments may specify the NVRAM modes in different ways, FIG. 3 describes the use of a decode table 333.

Figure 3:
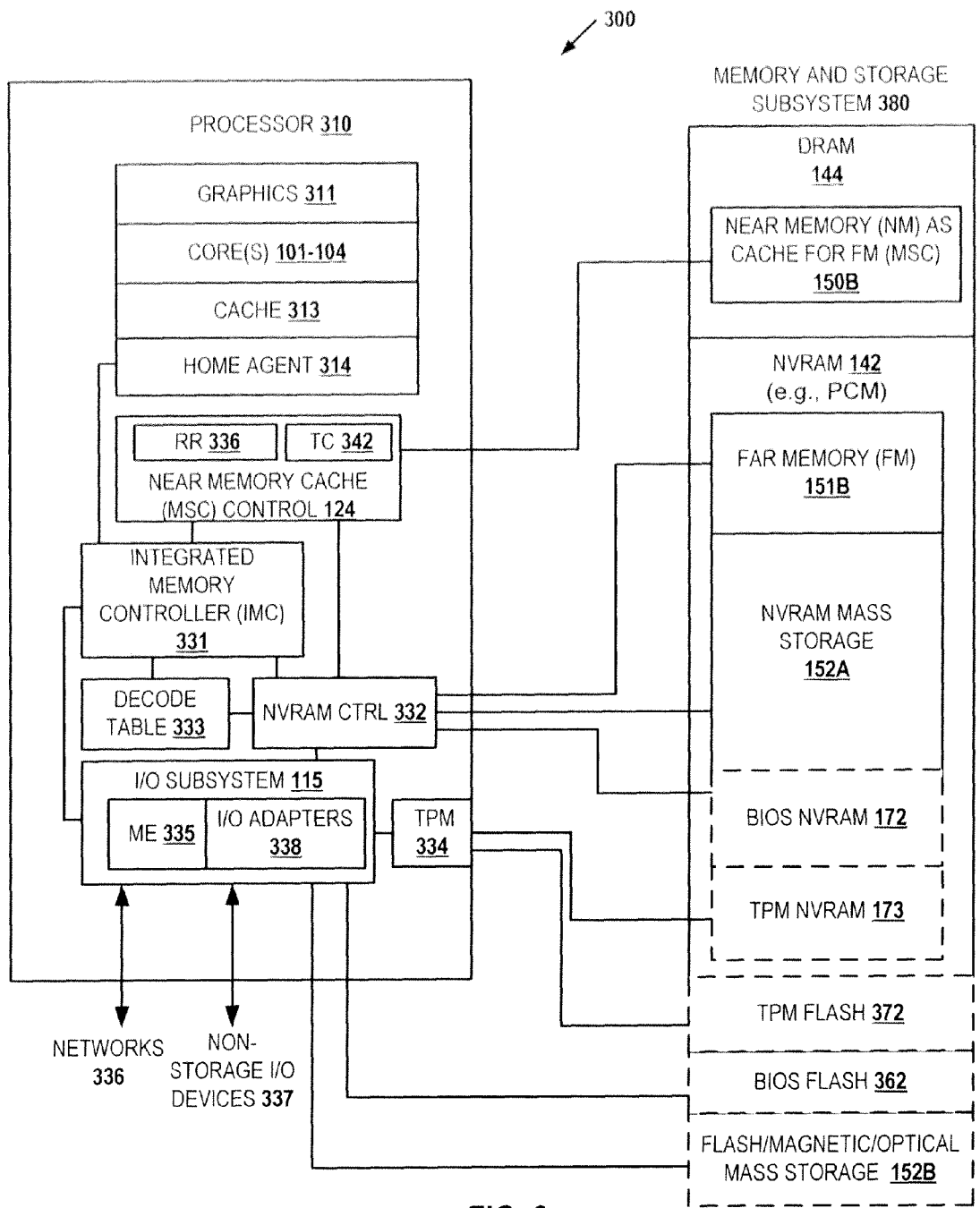
FIG. 3 illustrates a computer system on which embodiments of the invention may be implemented.

FIG. 3 illustrates an exemplary computer system 300 on which embodiments of the invention may be implemented. The computer system 300 includes a processor 310 and memory/storage subsystem 380 with a NVRAM 142 used for both system memory, mass storage, and optionally firmware memory. In one embodiment, the NVRAM 142 comprises the entire system memory and storage hierarchy used by computer system 300 for storing data, instructions, states, and other persistent and non-persistent information. As previously discussed, NVRAM 142 can be configured to implement the roles in a typical memory and storage hierarchy of system memory, mass storage, and firmware memory, TPM memory, and the like. In the embodiment of FIG. 3, NVRAM 142 is partitioned into FM 151B, NVRAM mass storage 152A, BIOS NVRAM 173, and TMP NVRAM 173. Storage hierarchies with different roles are also contemplated and the application of NVRAM 142 is not limited to the roles described above.

By way of example, operation while the near memory as cache for FM 150B is in the write-back caching is described. In one embodiment, while the near memory as cache for FM 150B is in the write-back caching mode mentioned above, a read operation will first arrive at the MSC controller 124 which will perform a look-up to determine if the requested data is present in the near memory acting as a cache for FM 150B (e.g., utilizing a tag cache 342). If present, it will return the data to the requesting CPU, core 101-104 or I/O device through I/O subsystem 115. If the data is not present, the MSC controller 124 will send the request along with the system memory address to an NVRAM controller 332. The NVRAM controller 332 will use the decode table 333 to translate the system memory address to an NVRAM physical device address (PDA) and direct the read operation to this region of the far memory 151B. In one embodiment, the decode table 333 includes an address indirection table (AIT) component which the NVRAM controller 332 uses to translate between system memory addresses and NVRAM PDAs. In one embodiment, the AIT is updated as part of the wear leveling algorithm implemented to distribute memory access operations and thereby reduce wear on the NVRAM FM 151B. Alternatively, the AIT may be a separate table stored within the NVRAM controller 332.

Upon receiving the requested data from the NVRAM FM 151B, the NVRAM controller 332 will return the requested data to the MSC controller 124 which will store the data in the MSC near memory acting as an FM cache 150B and also send the data to the requesting processor core 101-104, or I/O Device through I/O subsystem 115. Subsequent requests for this data may be serviced directly from the near memory acting as a FM cache 150B until it is replaced by some other NVRAM FM data.

As mentioned, in one embodiment, a memory write operation also first goes to the MSC controller 124 which writes it into the MSC near memory acting as a FM cache 150B. In write-back caching mode, the data may not be sent directly to the NVRAM FM 151B when a write operation is received. For example, the data may be sent to the NVRAM FM 151B only when the location in the MSC near memory acting as a FM cache 150B in which the data is stored must be re-used for storing data for a different system memory address. When this happens, the MSC controller 124 notices that the data is not current in NVRAM FM 151B and will thus retrieve it from near memory acting as a FM cache 150B and send it to the NVRAM controller 332. The NVRAM controller 332 looks up the PDA for the system memory address and then writes the data to the NVRAM FM 151B.

In FIG. 3, the NVRAM controller 332 is shown connected to the FM 151B, NVRAM mass storage 152A, and BIOS NVRAM 172 using three separate lines. This does not necessarily mean, however, that there are three separate physical buses or communication channels connecting the NVRAM controller 332 to these portions of the NVRAM 142. Rather, in some embodiments, a common memory bus or other type of bus (such as those described below with respect to FIGS. 4A-M) is used to communicatively couple the NVRAM controller 332 to the FM 151B, NVRAM mass storage 152A, and BIOS NVRAM 172. For example, in one embodiment, the three lines in FIG. 3 represent a bus, such as a memory bus (e.g., a DDR3, DDR4, etc, bus), over which the NVRAM controller 332 implements a transactional protocol to communicate with the NVRAM 142. The NVRAM controller 332 may also communicate with the NVRAM 142 over a bus supporting a native transactional protocol such as a PCI express bus, desktop management interface (DMI) bus, or any other type of bus utilizing a transactional protocol and a small enough transaction payload size (e.g., cache line size such as 64 or 128 byte).

In one embodiment, computer system 300 includes integrated memory controller (IMC) 331 which performs the central memory access control for processor 310, which is coupled to: 1) a memory-side cache (MSC) controller 124 to control access to near memory (NM) acting as a far memory cache 150B; and 2) a NVRAM controller 332 to control access to NVRAM 142. Although illustrated as separate units in FIG. 3, the MSC controller 124 and NVRAM controller 332 may logically form part of the IMC 331.

In the illustrated embodiment, the MSC controller 124 includes a set of range registers 336 which specify the mode of operation in use for the NM acting as a far memory cache 150B (e.g., write-back caching mode, near memory bypass mode, etc, described above). In the illustrated embodiment, DRAM 144 is used as the memory technology for the NM acting as cache for far memory 150B. In response to a memory access request, the MSC controller 124 may determine (depending on the mode of operation specified in the range registers 336) whether the request can be serviced from the NM acting as cache for FM 150B or whether the request must be sent to the NVRAM controller 332, which may then service the request from the far memory (FM) portion 151B of the NVRAM 142.

In an embodiment where NVRAM 142 is implemented with PCMS, NVRAM controller 332 is a PCMS controller that performs access with protocols consistent with the PCMS technology. As previously discussed, the PCMS memory is inherently capable of being accessed at the granularity of a byte. Nonetheless, the NVRAM controller 332 may access a PCMS-based far memory 151B at a lower level of granularity such as a cache line (e.g., a 64-bit or 128-bit cache line) or any other level of granularity consistent with the memory subsystem. The underlying principles of the invention are not limited to any particular level of granularity for accessing a PCMS-based far memory 151B. In general, however, when PCMS-based far memory 151B is used to form part of the system address space, the level of granularity will be higher than that traditionally used for other non-volatile storage technologies such as FLASH, which can only perform rewrite and erase operations at the level of a "block" (minimally 64 Kbyte in size for NOR FLASH and 16 Kbyte for NAND FLASH).

In the illustrated embodiment, NVRAM controller 332 can read configuration data to establish the previously described modes, sizes, etc. for the NVRAM 142 from decode table 333, or alternatively, can rely on the decoding results passed from IMC 331 and I/O subsystem 315. For example, at either manufacturing time or in the field, computer system 300 can program decode table 333 to mark different regions of NVRAM 142 as system memory, mass storage exposed via SATA interfaces, mass storage exposed via USB Bulk Only Transport (BOT) interfaces, encrypted storage that supports TPM storage, among others. The means by which access is steered to different partitions of NVRAM device 142 is via a decode logic. For example, in one embodiment, the address range of each partition is defined in the decode table 333. In one embodiment, when IMC 331 receives an access request, the target address of the request is decoded to reveal whether the request is directed toward memory, NVRAM mass storage, or I/O. If it is a memory request, IMC 331 and/or the MSC controller 124 further determines from the target address whether the request is directed to NM as cache for FM 150B or to FM 151B. For FM 151B access, the request is forwarded to NVRAM controller 332. IMC 331 passes the request to the I/O subsystem 115 if this request is directed to I/O (e.g., non-storage and storage I/O devices). I/O subsystem 115 further decodes the address to determine whether the address points to NVRAM mass storage 152A, BIOS NVRAM 172, or other non-storage or storage I/O devices. If this address points to NVRAM mass storage 152A or BIOS NVRAM 172, I/O subsystem 115 forwards the request to NVRAM controller 332. If this address points to TMP NVRAM 173, I/O subsystem 115 passes the request to TPM 334 to perform secured access.

In one embodiment, each request forwarded to NVRAM controller 332 is accompanied with an attribute (also known as a "transaction type") to indicate the type of access. In one embodiment, NVRAM controller 332 may emulate the access protocol for the requested access type, such that the rest of the platform remains unaware of the multiple roles performed by NVRAM 142 in the memory and storage hierarchy. In alternative embodiments, NVRAM controller 332 may perform memory access to NVRAM 142 regardless of which transaction type it is. It is understood that the decode path can be different from what is described above. For example, IMC 331 may decode the target address of an access request and determine whether it is directed to NVRAM 142. If it is directed to NVRAM 142, IMC 331 generates an attribute according to decode table 333. Based on the attribute, IMC 331 then forwards the request to appropriate downstream logic (e.g., NVRAM controller 332 and I/O subsystem 315) to perform the requested data access. In yet another embodiment, NVRAM controller 332 may decode the target address if the corresponding attribute is not passed on from the upstream logic (e.g., IMC 331 and I/O subsystem 315). Other decode paths may also be implemented.

The presence of a new memory architecture such as described herein provides for a wealth of new possibilities. Although discussed at much greater length further below, some of these possibilities are quickly highlighted immediately below.

According to one possible implementation, NVRAM 142 acts as a total replacement or supplement for traditional DRAM technology in system memory. In one embodiment, NVRAM 142 represents the introduction of a second-level system memory (e.g., the system memory may be viewed as having a first level system memory comprising near memory as cache 150B (part of the DRAM device 340) and a second level system memory comprising far memory (FM) 151B (part of the NVRAM 142).

According to some embodiments, NVRAM 142 acts as a total replacement or supplement for the flash/magnetic/optical mass storage 152B. As previously described, in some embodiments, even though the NVRAM 152A is capable of byte-level addressability, NVRAM controller 332 may still access NVRAM mass storage 152A in blocks of multiple bytes, depending on the implementation (e.g., 64 Kbytes, 128 Kbytes, etc.). The specific manner in which data is accessed from NVRAM mass storage 152A by NVRAM controller 332 may be transparent to software executed by the processor 310. For example, even through NVRAM mass storage 152A may be accessed differently from Flash/magnetic/optical mass storage 152A, the operating system may still view NVRAM mass storage 152A as a standard mass storage device (e.g., a serial ATA hard drive or other standard form of mass storage device).

In an embodiment where NVRAM mass storage 152A acts as a total replacement for the flash/magnetic/optical mass storage 152B, it is not necessary to use storage drivers for block-addressable storage access. The removal of storage driver overhead from storage access can increase access speed and save power. In alternative embodiments where it is desired that NVRAM mass storage 152A appears to the OS and/or applications as block-accessible and indistinguishable from flash/magnetic/optical mass storage 152B, emulated storage drivers can be used to expose block-accessible interfaces (e.g., Universal Serial Bus (USB) Bulk-Only Transfer (BOT), 1.0; Serial Advanced Technology Attachment (SATA), 3.0; and the like) to the software for accessing NVRAM mass storage 152A.

In one embodiment, NVRAM 142 acts as a total replacement or supplement for firmware memory such as BIOS flash 362 and TPM flash 372 (illustrated with dotted lines in FIG. 3 to indicate that they are optional). For example, the NVRAM 142 may include a BIOS NVRAM 172 portion to supplement or replace the BIOS flash 362 and may include a TPM NVRAM 173 portion to supplement or replace the TPM flash 372. Firmware memory can also store system persistent states used by a TPM 334 to protect sensitive system information (e.g., encryption keys). In one embodiment, the use of NVRAM 142 for firmware memory removes the need for third party flash parts to store code and data that are critical to the system operations.

Continuing then with a discussion of the system of FIG. 3, in some embodiments, the architecture of computer system 100 may include multiple processors, although a single processor 310 is illustrated in FIG. 3 for simplicity. Processor 310 may be any type of data processor including a general purpose or special purpose central processing unit (CPU), an application-specific integrated circuit (ASIC) or a digital signal processor (DSP). For example, processor 310 may be a general-purpose processor, such as a Core™ i3, i5, i7, 2 Duo and Quad, Xeon™, or Itanium™ processor, all of which are available from Intel Corporation, of Santa Clara, Calif. Alternatively, processor 310 may be from another company, such as ARM Holdings, Ltd, of Sunnyvale, Calif., MIPS Technologies of Sunnyvale, Calif., etc. Processor 310 may be a special-purpose processor, such as, for example, a network or communication processor, compression engine, graphics processor, co-processor, embedded processor, or the like. Processor 310 may be implemented on one or more chips included within one or more packages. Processor 310 may be a part of and/or may be implemented on one or more substrates using any of a number of process technologies, such as, for example, BiCMOS, CMOS, or NMOS. In the embodiment shown in FIG. 3, processor 310 has a system-on-a-chip (SOC) configuration.

In one embodiment, the processor 310 includes an integrated graphics unit 311 which includes logic for executing graphics commands such as 3D or 2D graphics commands. While the embodiments of the invention are not limited to any particular integrated graphics unit 311, in one embodiment, the graphics unit 311 is capable of executing industry standard graphics commands such as those specified by the Open GL and/or Direct X application programming interfaces (APIs) (e.g., OpenGL 4.1 and Direct X 11).

The processor 310 may also include one or more cores 101-104, although a single core is illustrated in FIG. 3, again, for the sake of clarity. In many embodiments, the core(s) 101-104 includes internal functional blocks such as one or more execution units, retirement units, a set of general purpose and specific registers, etc. If the core(s) are multi-threaded or hyper-threaded, then each hardware thread may be considered as a "logical" core as well. The cores 101-104 may be homogenous or heterogeneous in terms of architecture and/or instruction set. For example, some of the cores may be in order while others are out-of-order. As another example, two or more of the cores may be capable of executing the same instruction set, while others may be capable of executing only a subset of that instruction set or a different instruction set.

The processor 310 may also include one or more caches, such as cache 313 which may be implemented as a SRAM and/or a DRAM. In many embodiments that are not shown, additional caches other than cache 313 are implemented so that multiple levels of cache exist between the execution units in the core(s) 101-104 and memory devices 150B and 151B. For example, the set of shared cache units may include an upper-level cache, such as a level 1 (L1) cache, mid-level caches, such as level 2 (L2), level 3 (L3), level 4 (L4), or other levels of cache, an (LLC), and/or different combinations thereof. In different embodiments, cache 313 may be apportioned in different ways and may be one of many different sizes in different embodiments. For example, cache 313 may be an 8 megabyte (MB) cache, a 16 MB cache, etc. Additionally, in different embodiments the cache may be a direct mapped cache, a fully associative cache, a multi-way set-associative cache, or a cache with another type of mapping. In other embodiments that include multiple cores, cache 313 may include one large portion shared among all cores or may be divided into several separately functional slices (e.g., one slice for each core). Cache 313 may also include one portion shared among all cores and several other portions that are separate functional slices per core.

The processor 310 may also include a home agent 314 which includes those components coordinating and operating core(s) 101-104. The home agent unit 314 may include, for example, a power control unit (PCU) and a display unit. The PCU may be or include logic and components needed for regulating the power state of the core(s) 101-104 and the integrated graphics unit 311. The display unit is for driving one or more externally connected displays.

As mentioned, in some embodiments, processor 310 includes an integrated memory controller (IMC) 331, near memory cache (MSC) controller, and NVRAM controller 332 all of which can be on the same chip as processor 310, or on a separate chip and/or package connected to processor 310. DRAM device 144 may be on the same chip or a different chip as the IMC 331 and MSC controller 124; thus, one chip may have processor 310 and DRAM device 144; one chip may have the processor 310 and another the DRAM device 144 and (these chips may be in the same or different packages); one chip may have the core(s) 101-104 and another the IMC 331, MSC controller 124 and DRAM 144 (these chips may be in the same or different packages); one chip may have the core(s) 101-104, another the IMC 331 and MSC controller 124, and another the DRAM 144 (these chips may be in the same or different packages); etc.

In some embodiments, processor 310 includes an I/O subsystem 115 coupled to IMC 331. I/O subsystem 115 enables communication between processor 310 and the following serial or parallel I/O devices: one or more networks 336 (such as a Local Area Network, Wide Area Network or the Internet), storage I/O device (such as flash/magnetic/optical mass storage 152B, BIOS flash 362, TPM flash 372) and one or more non-storage I/O devices 337 (such as display, keyboard, speaker, and the like). I/O subsystem 115 may include a platform controller hub (PCH) (not shown) that further includes several I/O adapters 338 and other I/O circuitry to provide access to the storage and non-storage I/O devices and networks. To accomplish this, I/O subsystem 115 may have at least one integrated I/O adapter 338 for each I/O protocol utilized. I/O subsystem 115 can be on the same chip as processor 310, or on a separate chip and/or package connected to processor 310.

I/O adapters 338 translate a host communication protocol utilized within the processor 310 to a protocol compatible with particular I/O devices. For flash/magnetic/optical mass storage 152B, some of the protocols that I/O adapters 338 may translate include Peripheral Component Interconnect (PCI)-Express (PCI-E), 3.0; USB, 3.0; SATA, 3.0; Small Computer System Interface (SCSI), Ultra-640; and Institute of Electrical and Electronics Engineers (IEEE) 1394 "Firewire;" among others. For BIOS flash 362, some of the protocols that I/O adapters 338 may translate include Serial Peripheral Interface (SPI), Microwire, among others. Additionally, there may be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

In some embodiments, the I/O subsystem 115 is coupled to a TPM control 334 to control access to system persistent states, such as secure data, encryption keys, platform configuration information and the like. In one embodiment, these system persistent states are stored in a TMP NVRAM 173 and accessed via NVRAM controller 332.

In one embodiment, TPM 334 is a secure micro-controller with cryptographic functionalities. TPM 334 has a number of trust-related capabilities; e.g., a SEAL capability for ensuring that data protected by a TPM is only available for the same TPM. TPM 334 can protect data and keys (e.g., secrets) using its encryption capabilities. In one embodiment, TPM 334 has a unique and secret RSA key, which allows it to authenticate hardware devices and platforms. For example, TPM 334 can verify that a system seeking access to data stored in computer system 300 is the expected system. TPM 334 is also capable of reporting the integrity of the platform (e.g., computer system 300). This allows an external resource (e.g., a server on a network) to determine the trustworthiness of the platform but does not prevent access to the platform by the user.

In some embodiments, I/O subsystem 315 also includes a Management Engine (ME) 335, which is a microprocessor that allows a system administrator to monitor, maintain, update, upgrade, and repair computer system 300. In one embodiment, a system administrator can remotely configure computer system 300 by editing the contents of the decode table 333 through ME 335 via networks 336.

For convenience of explanation, the remainder of the application sometimes refers to NVRAM 142 as a PCMS device. A PCMS device includes multi-layered (vertically stacked) PCM cell arrays that are non-volatile, have low power consumption, and are modifiable at the bit level. As such, the terms NVRAM device and PCMS device may be used interchangeably in the following discussion. However it should be realized, as discussed above, that different technologies besides PCMS may also be utilized for NVRAM 142.

It should be understood that a computer system can utilize NVRAM 142 for system memory, mass storage, firmware memory and/or other memory and storage purposes even if the processor of that computer system does not have all of the above-described components of processor 310, or has more components than processor 310.

In the particular embodiment shown in FIG. 3, the MSC controller 124 and NVRAM controller 332 are located on the same die or package (referred to as the CPU package) as the processor 310. In other embodiments, the MSC controller 124 and/or NVRAM controller 332 may be located off-die or off-CPU package, coupled to the processor 310 or CPU package over a bus such as a memory bus (like a DDR bus (e.g., a DDR3, DDR4, etc)), a PCI express bus, a desktop management interface (DMI) bus, or any other type of bus.

Exemplary PCM Bus and Packaging Configurations

FIGS. 4A-M illustrates a variety of different deployments in which the processor, near memory and far memory are configured and packaged in different ways. In particular, the series of platform memory configurations illustrated in FIGS. 4A-M enable the use of new non-volatile system memory such as PCM technologies or, more specifically, PCMS technologies.

Figure 4A:
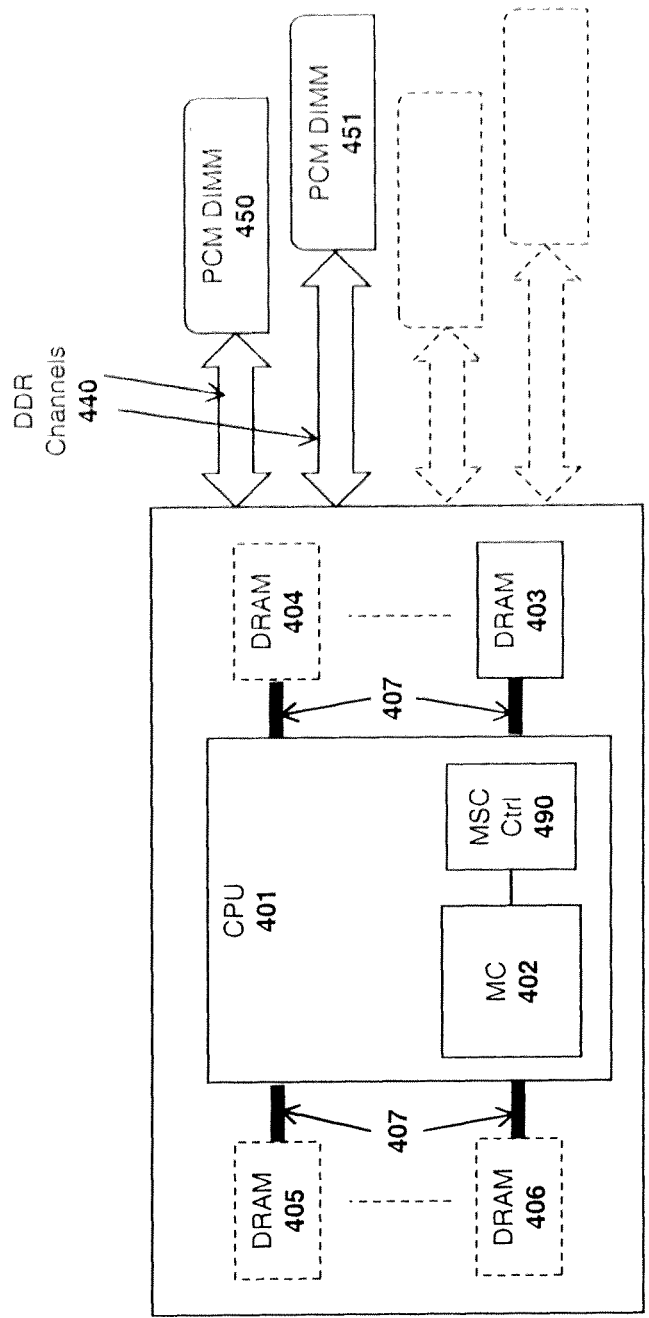
FIG. 4A illustrates a first system architecture which includes PCM according to embodiments of the invention.
Figure 4B:
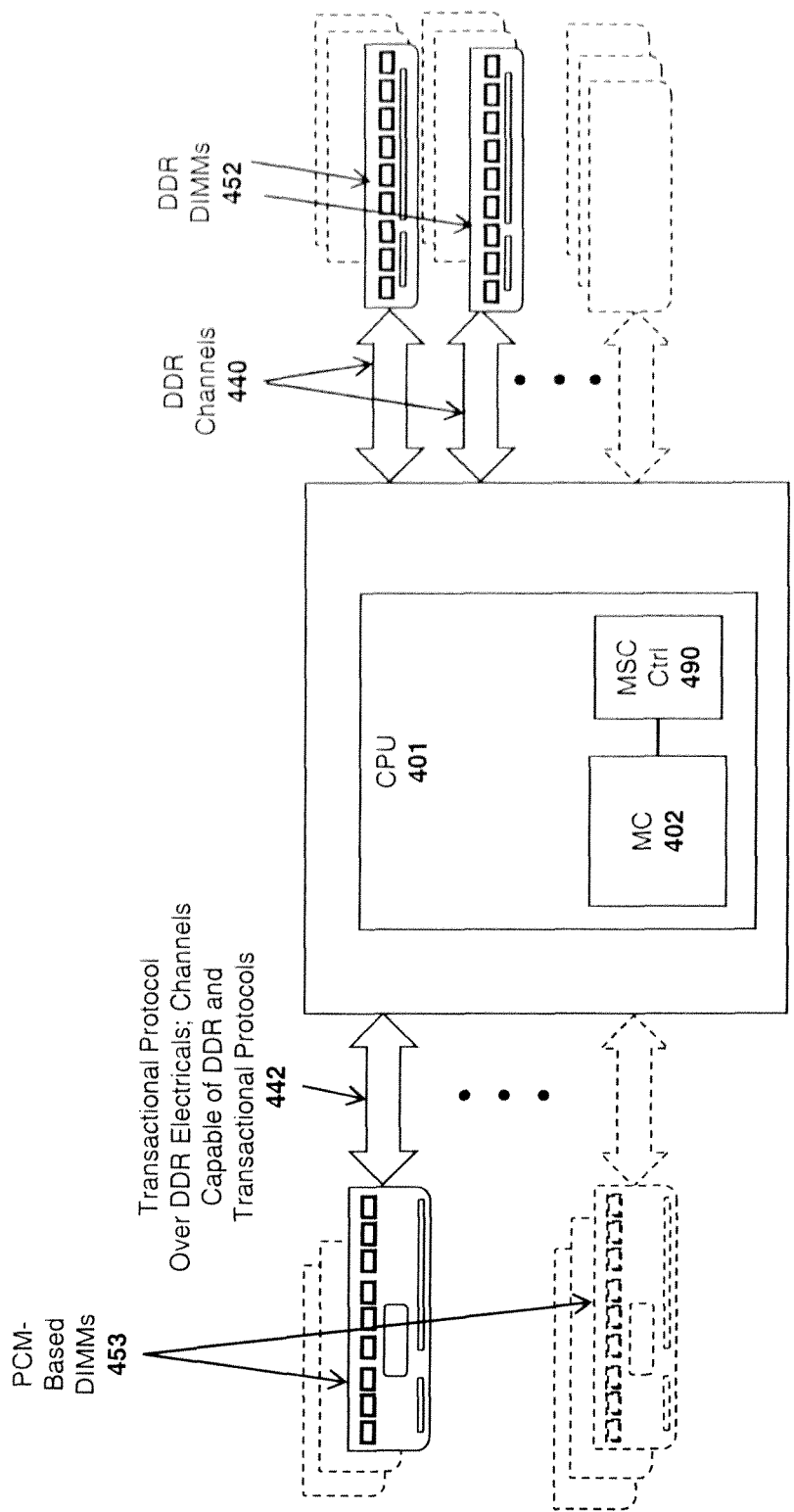
FIG. 4B illustrates a second system architecture which includes PCM according to embodiments of the invention.
Figure 4C:
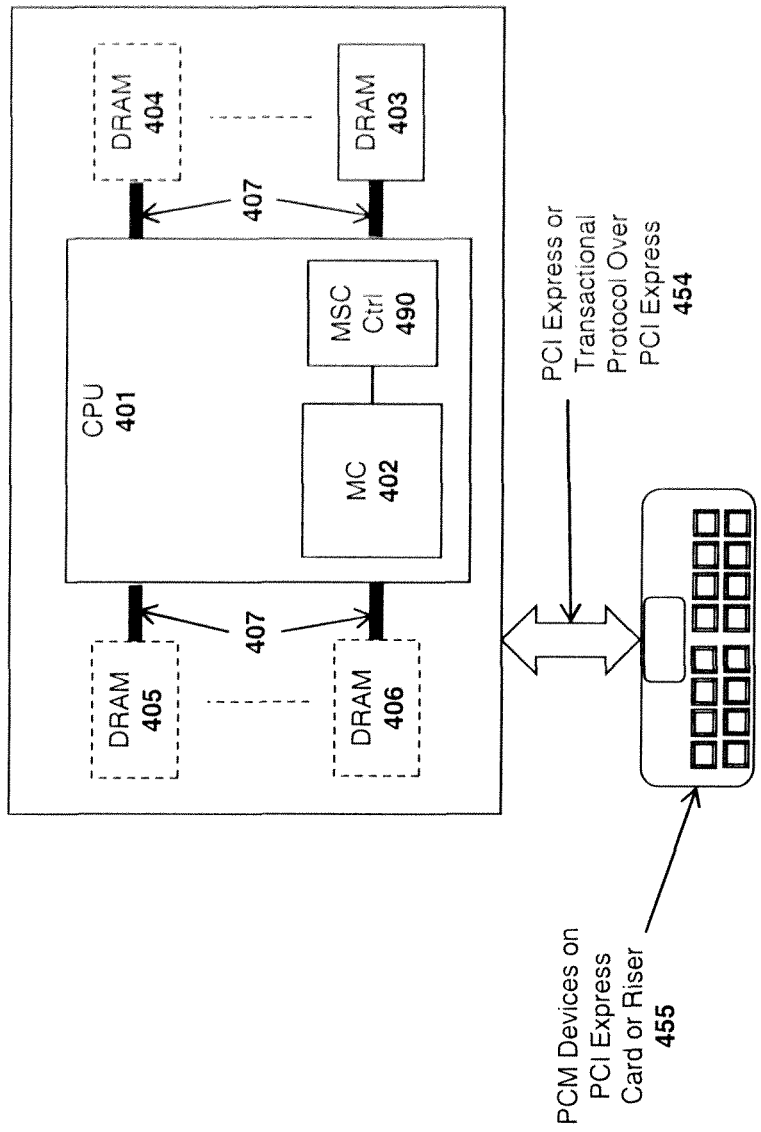
FIG. 4C illustrates a third system architecture which includes PCM according to embodiments of the invention.
Figure 4D:
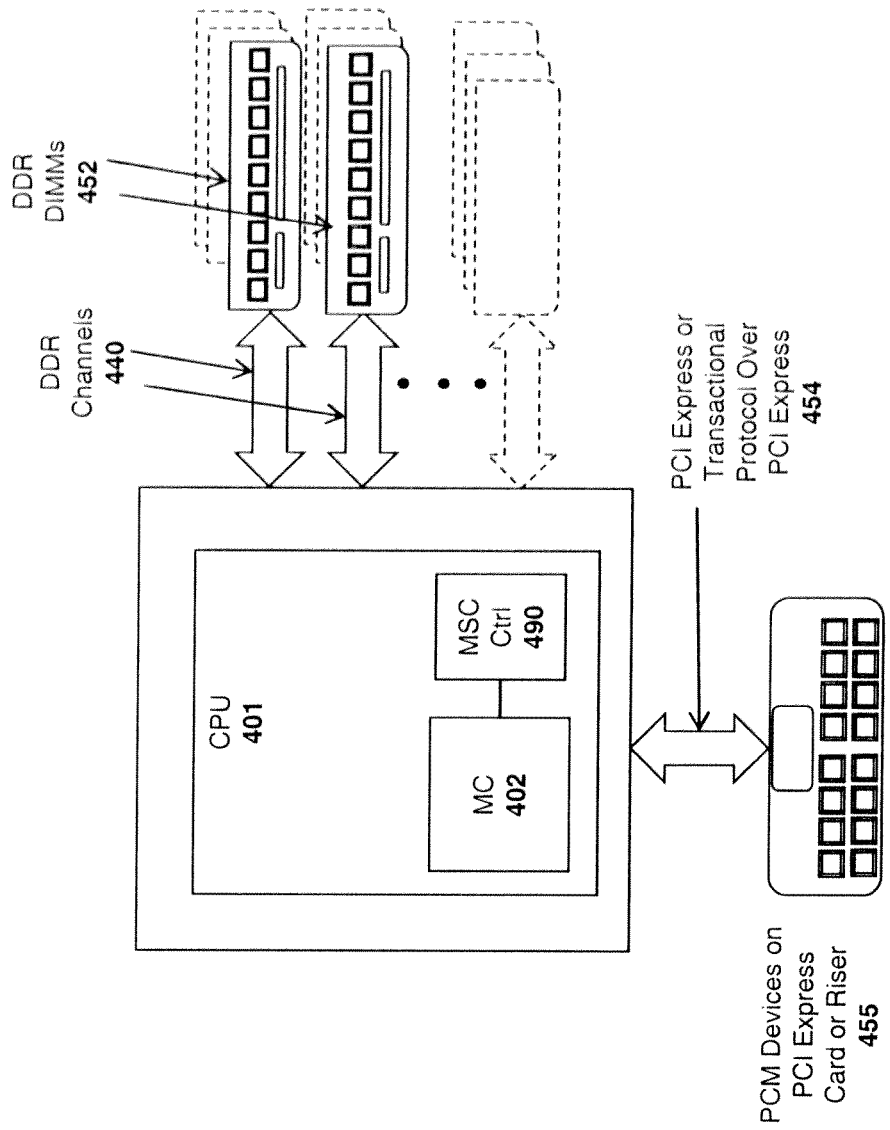
FIG. 4D illustrates a fourth system architecture which includes PCM according to embodiments of the invention.
Figure 4E:
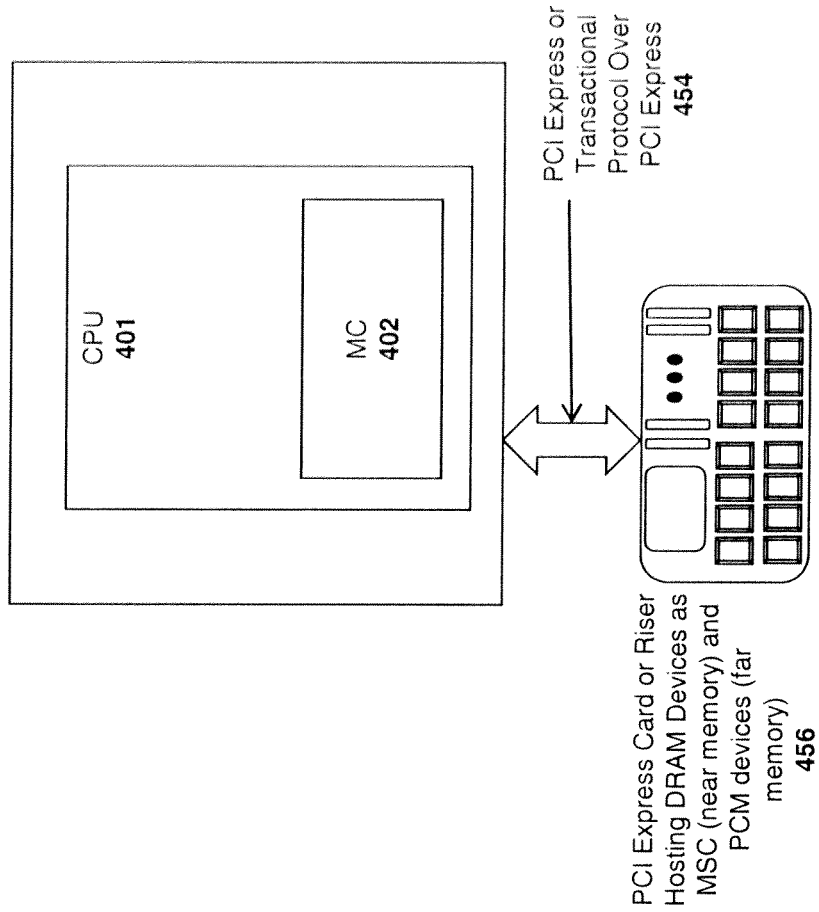
FIG. 4E illustrate a fifth system architecture which includes PCM according to embodiments of the invention.
Figure 4F:
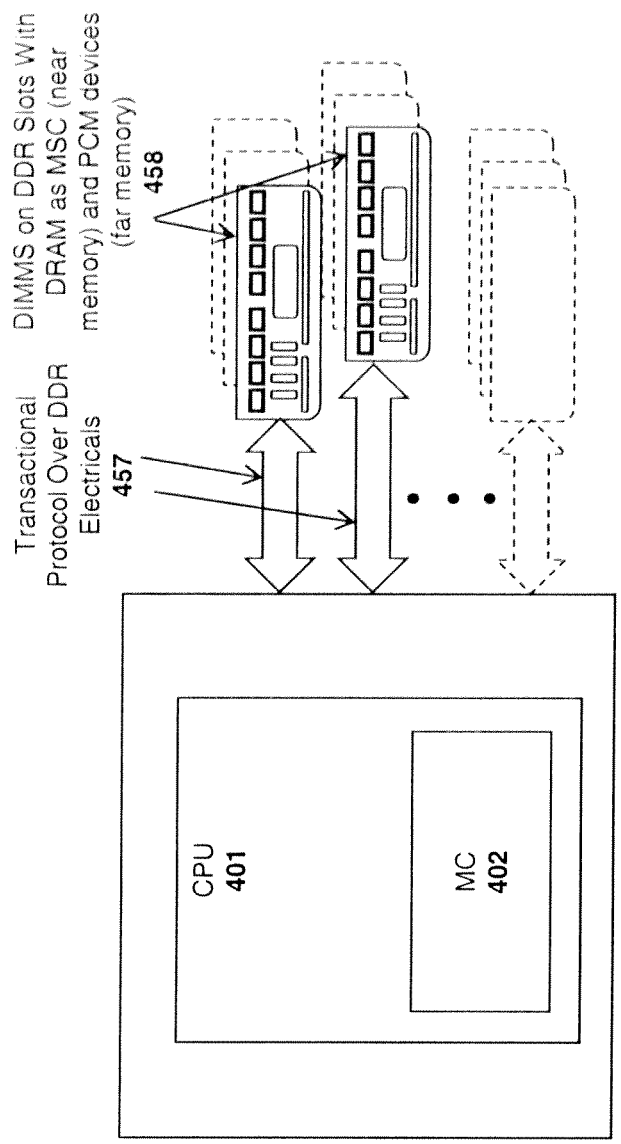
FIG. 4F illustrate a sixth system architecture which includes PCM according to embodiments of the invention.
Figure 4G:
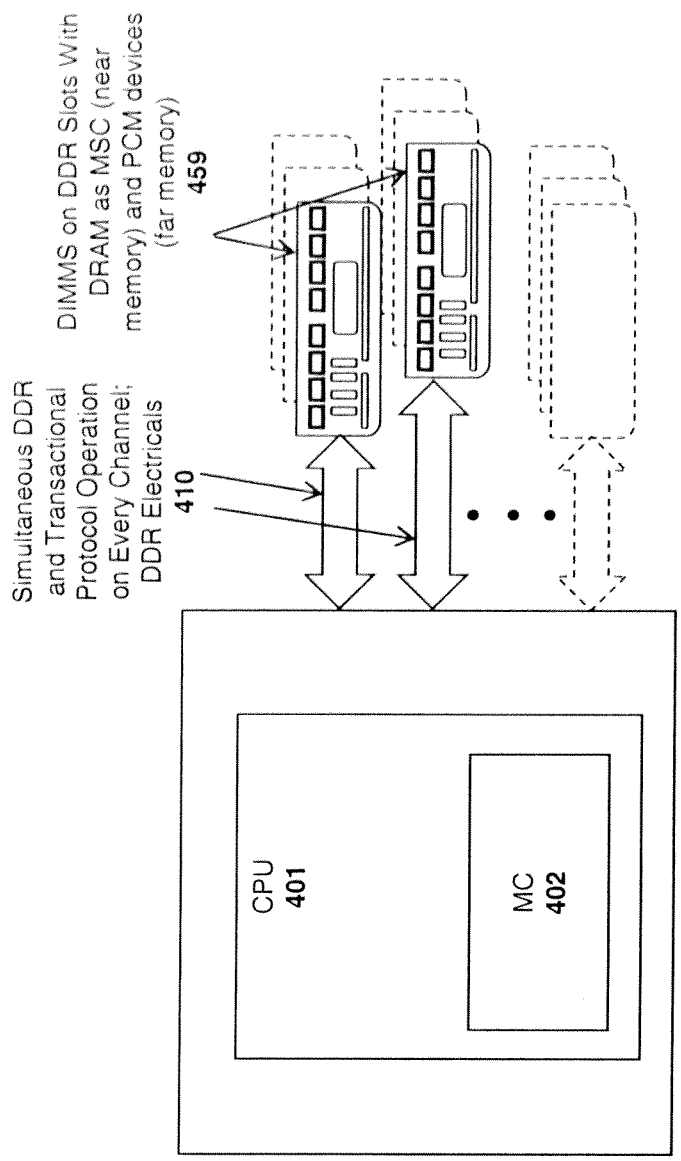
FIG. 4G illustrates a seventh system architecture which includes PCM according to embodiments of the invention.
Figure 4H:
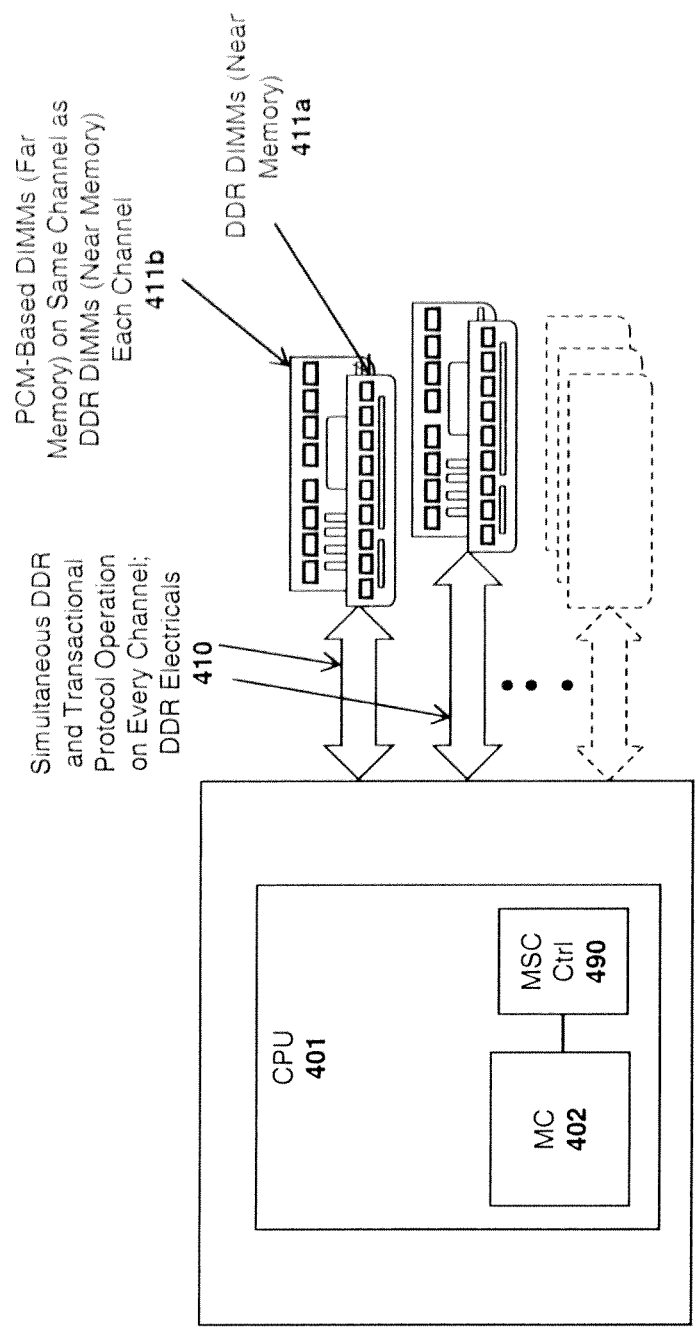
FIG. 4H illustrates an eight system architecture which includes PCM according to embodiments of the invention.
Figure 4I:
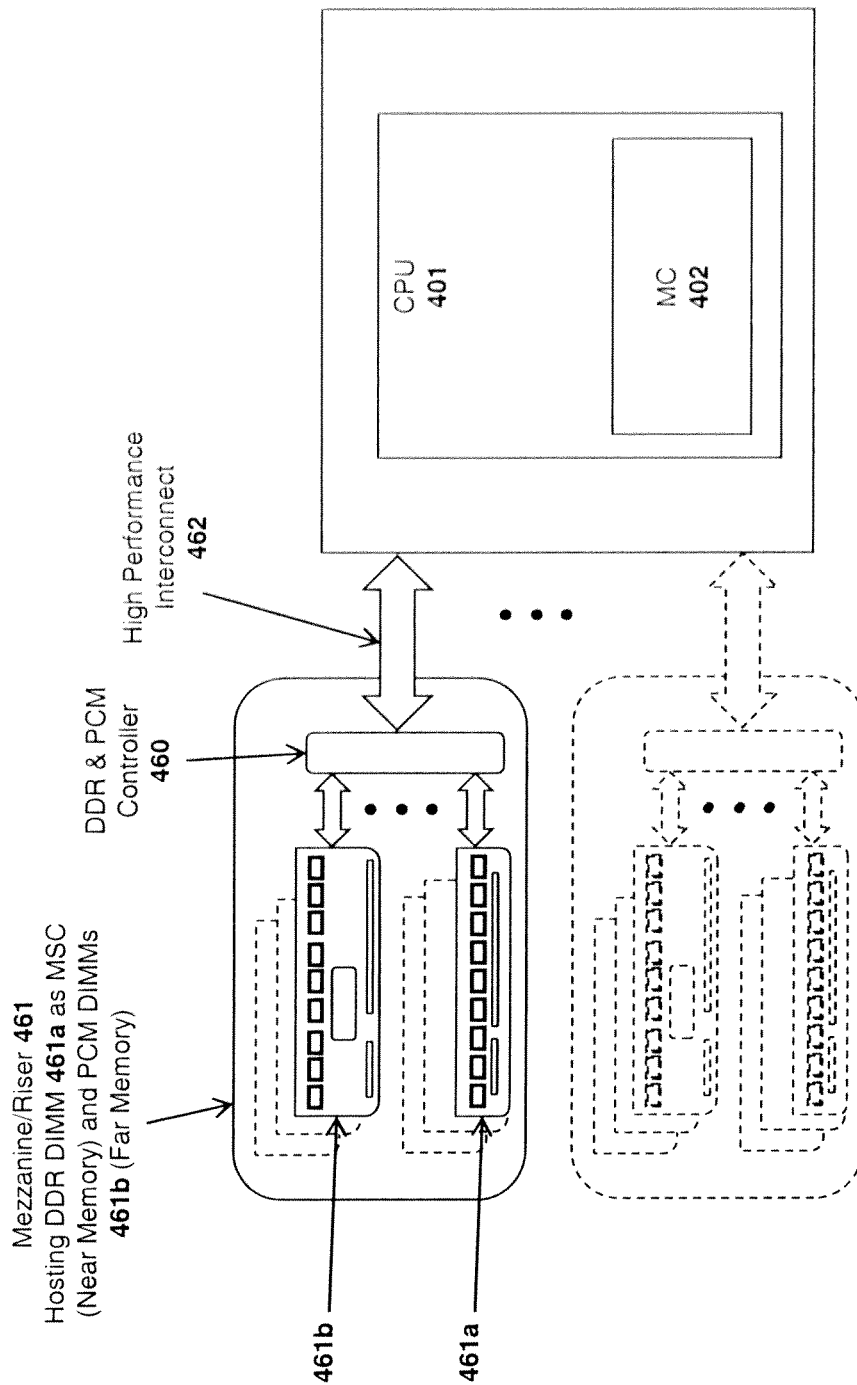
FIG. 4I illustrates a ninth system architecture which includes PCM according to embodiments of the invention.
Figure 4J:
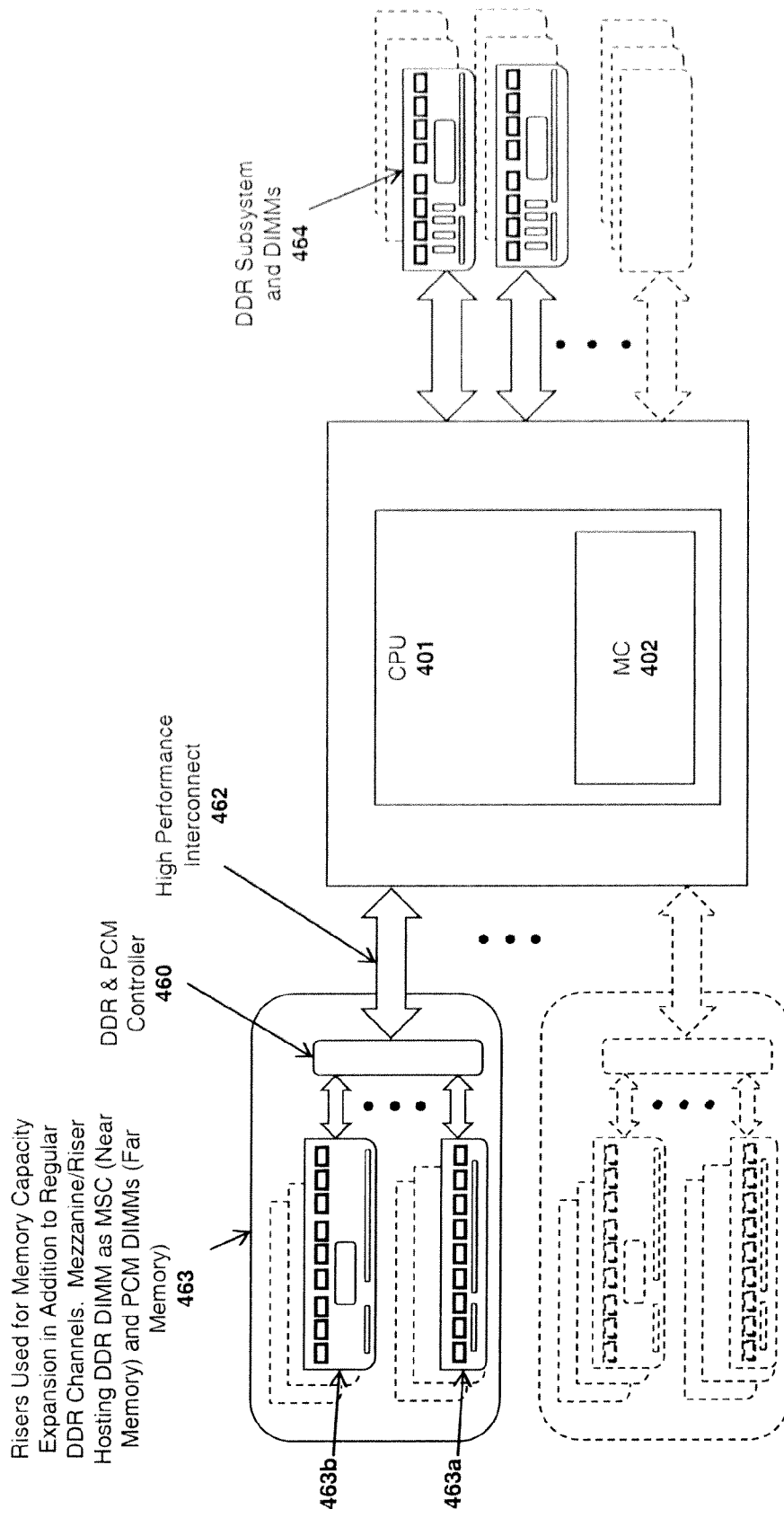
FIG. 4J illustrates a tenth system architecture which includes PCM according to embodiments of the invention.
Figure 4K:
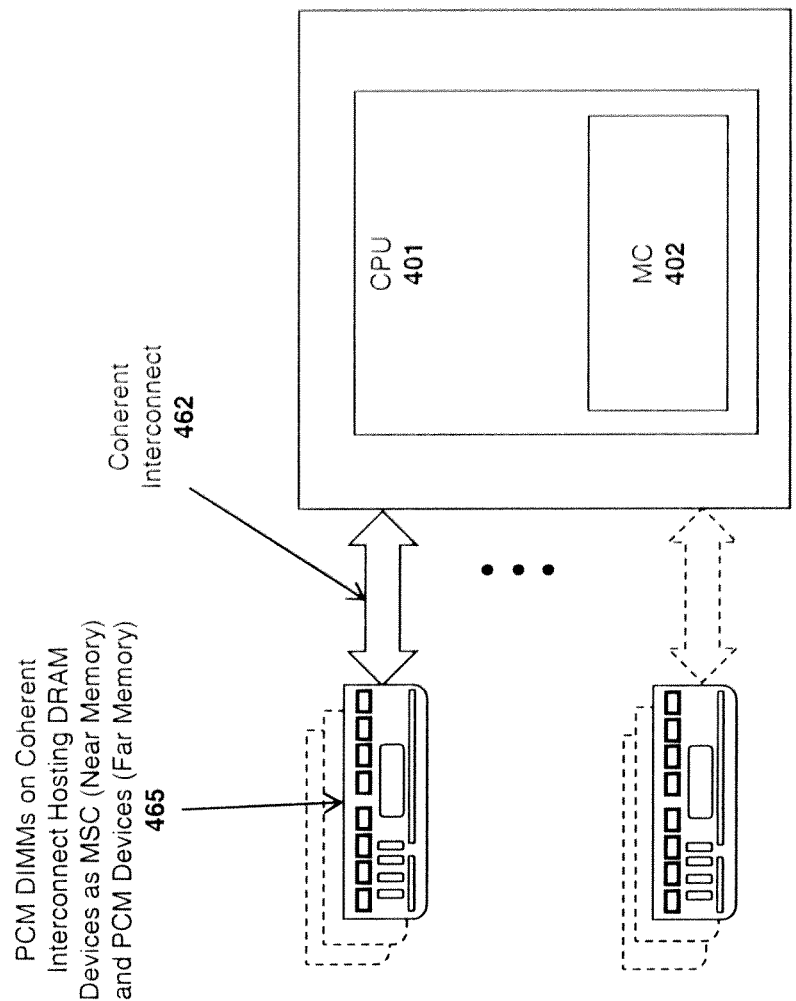
FIG. 4K illustrates an eleventh system architecture which includes PCM according to embodiments of the invention.
Figure 4L:
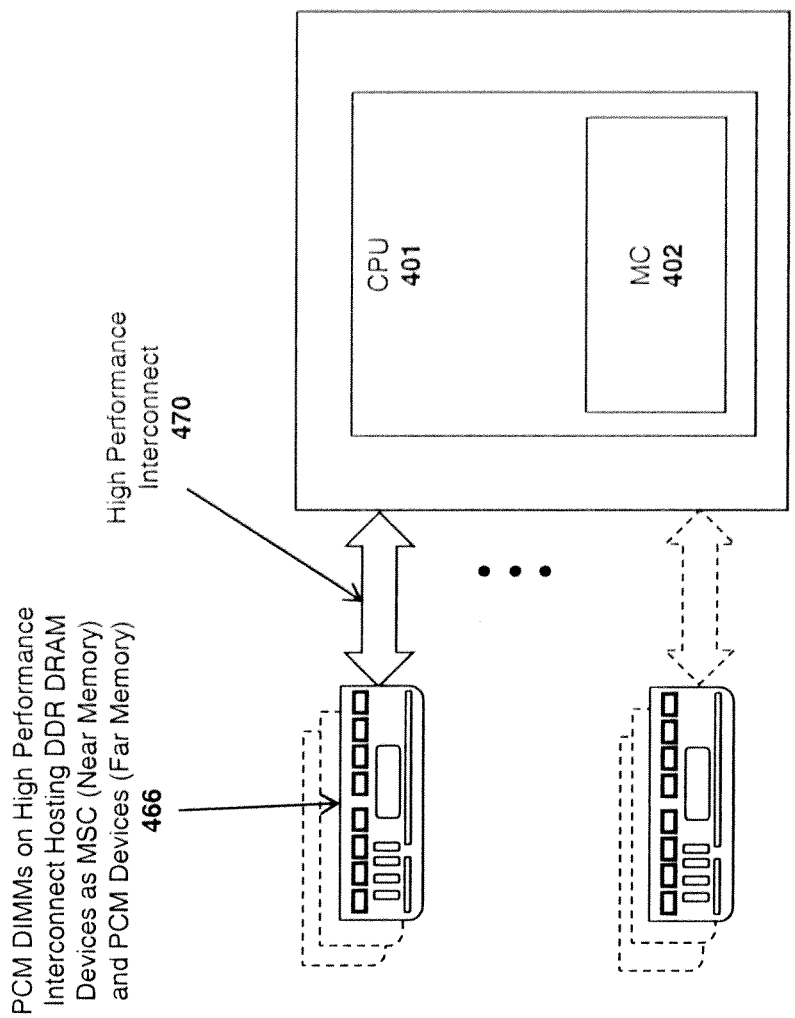
FIG. 4L illustrates a twelfth system architecture which includes PCM according to embodiments of the invention.
Figure 4M:
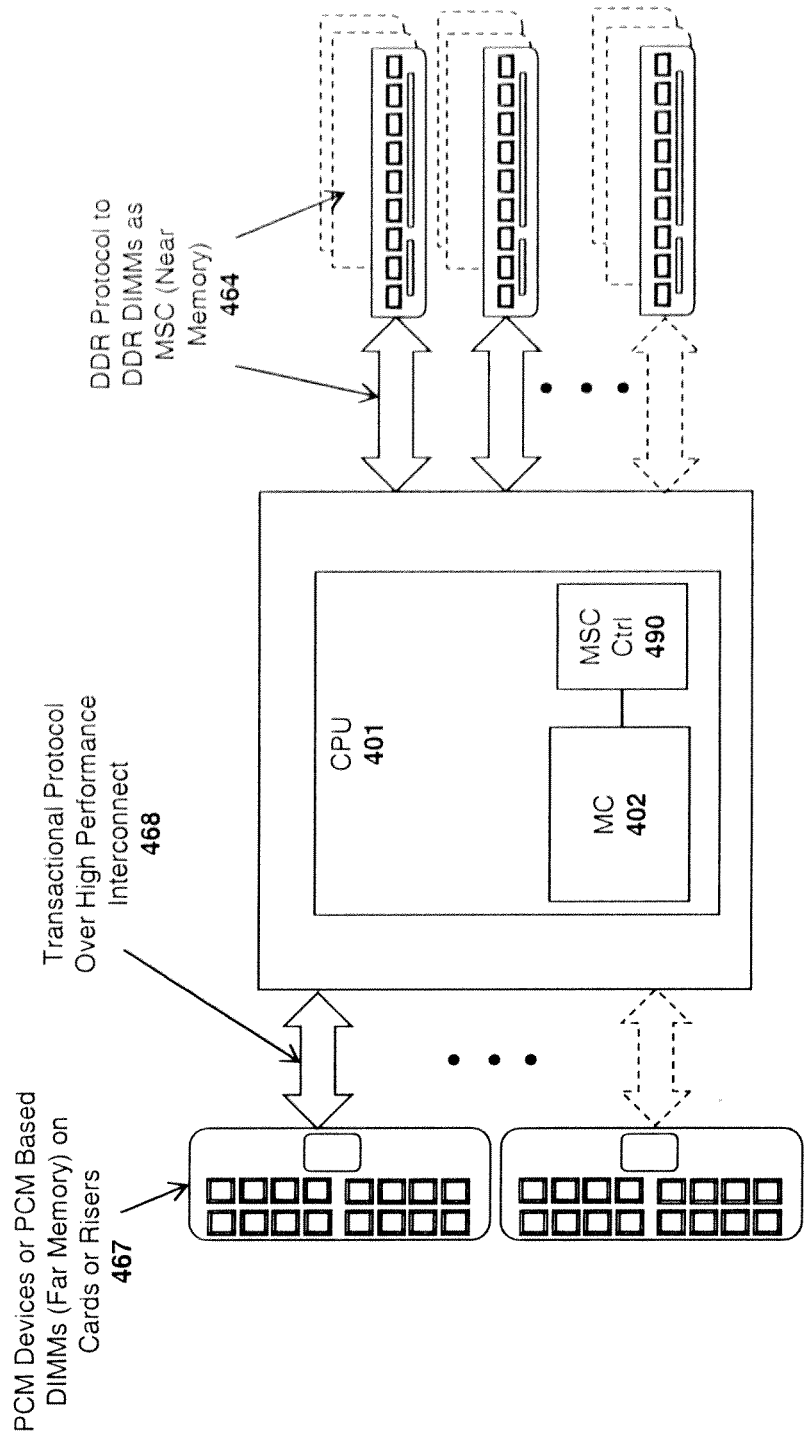
FIG. 4M and 4N illustrate a thirteenth and fourteenth system architecture which includes PCM according to embodiments of the invention.
Figure 4N:
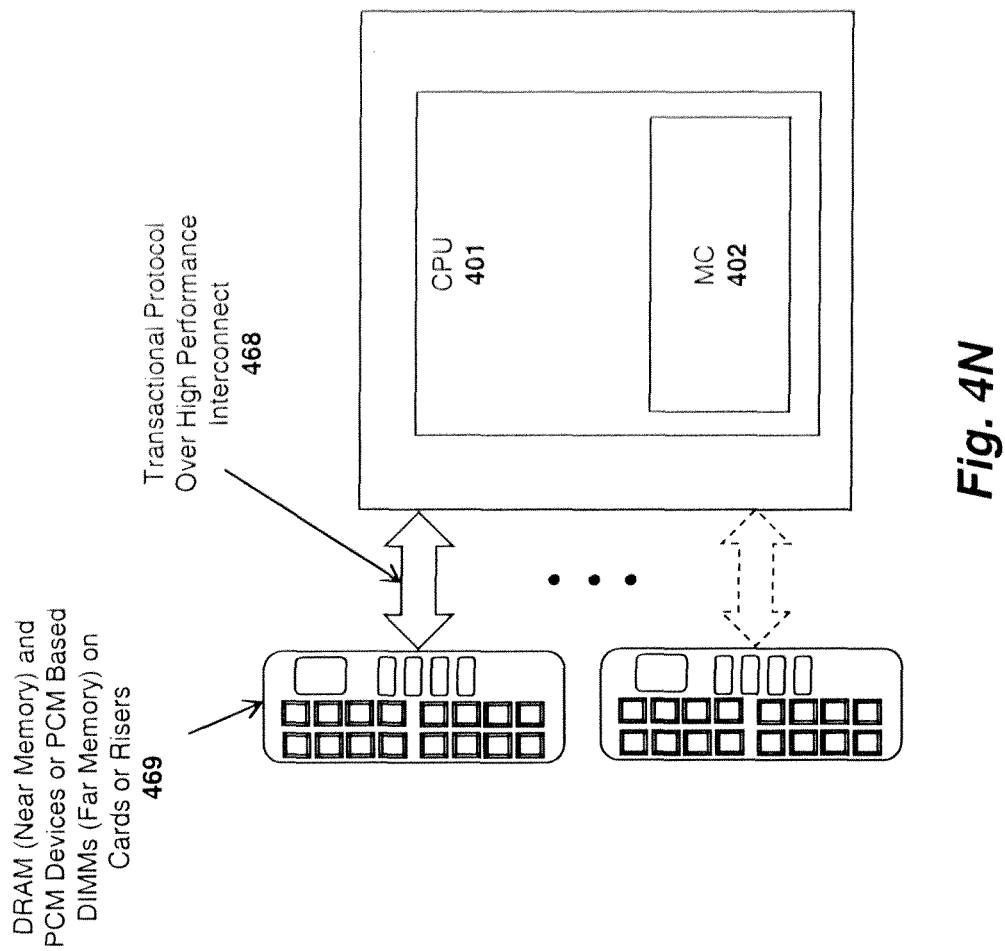

While some of the same numerical designations are used across multiple figures in FIGS. 4A-N, this does not necessarily mean that that the structures identified by those numerical designations are always identical. For example, while the same numbers are used to identify an integrated memory controller (IMC) 331 and CPU 401 in several figures, these components may be implemented differently in different figures. Some of these differences are not highlighted because they are not pertinent to understanding the underlying principles of the invention.

While several different system platform configuration approaches are described below, these approaches fall into two broad categories: split architecture, and unified architecture. Briefly, in the split architecture scheme, a memory side cache (MSC) controller (e.g., located in the processor die or on a separate die in the CPU package) intercepts all system memory requests. There are two separate interfaces that "flow downstream" from that controller that exit the CPU package to couple to the Near Memory and Far Memory. Each interface is tailored for the specific type of memory and each memory can be scaled independently in terms of performance and capacity.

In the unified architecture scheme a single memory interface exits the processor die or CPU package and all memory requests are sent to this interface. The MSC controller along with the Near and Far Memory subsystems are consolidated on this single interface. This memory interface must be tailored to meet the memory performance requirements of the processor and must support a transactional, out-of-order protocol at least because PCMS devices may not process read requests in order. In accordance with the above general categories, the following specific platform configurations may be employed.

The embodiments described below include various types of buses/channels. The terms "bus" and "channel" are used synonymously herein. The number of memory channels per DIMM socket will depend on the particular CPU package used in the computer system (with some CPU packages supporting, for example, three memory channels per socket).

Additionally, in the embodiments described below which use DRAM, virtually any type of DRAM memory channels may be used including, by way of example and not limitation, DDR channels (e.g., DDR3, DDR4, DDR5, etc). Thus, while DDR is advantageous because of its wide acceptance in the industry, resulting price point, etc., the underlying principles of the invention are not limited to any particular type of DRAM or volatile memory.

FIG. 4A illustrates one embodiment of a split architecture which includes one or more DRAM devices 403-406 operating as near memory acting as cache for FM (i.e., MSC) in the CPU package 401 (either on the processor die or on a separate die) and one or more NVRAM devices such as PCM memory residing on DIMMs 450-451 acting as far memory. High bandwidth links 407 on the CPU package 401 interconnect a single or multiple DRAM devices 403-406 to the processor 310 which hosts the integrated memory controller (IMC) 331 and MSC controller 124. Although illustrated as separate units in FIG. 4A and other figures described below, the MSC controller 124 may be integrated within the memory controller 331 in one embodiment.

The DIMMs 450-451 use DDR slots and electrical connections defining a DDR channels 440 with DDR address, data and control lines and voltages (e.g., the DDR3 or DDR4 standard as defined by the Joint Electron Devices Engineering Council (JEDEC)). The PCM devices on the DIMMs 450-451 provide the far memory capacity of this split architecture, with the DDR channels 440 to the CPU package 401 able to carry both DDR and transactional protocols. In contrast to DDR protocols in which the processor 310 or other logic within the CPU package (e.g., the IMC 331 or MSC controller 124) transmits a command and receives an immediate response, the transactional protocol used to communicate with PCM devices allows the CPU 401 to issue a series of transactions, each identified by a unique transaction ID. The commands are serviced by a PCM controller on the recipient one of the PCM DIMMs, which sends responses back to the CPU package 401, potentially out of order. The processor 310 or other logic within the CPU package 401 identifies each transaction response by its transaction ID, which is sent with the response. The above configuration allows the system to support both standard DDR DRAM-based DIMMs (using DDR protocols over DDR electrical connections) and PCM-based DIMMs configurations (using transactional protocols over the same DDR electrical connections).

FIG. 4B illustrates a split architecture which uses DDR DRAM-based DIMMs 452 coupled over DDR channels 440 to form near memory which acts as an MSC. The processor 310 hosts the memory controller 331 and MSC controller 124. NVRAM devices such as PCM memory devices reside on PCM-based DIMMs 453 that use DDR slots and electrical connections on additional DDR channels 442 off the CPU package 401. The PCM-based DIMMs 453 provide the far memory capacity of this split architecture, with the DDR channels 442 to the CPU package 401 being based on DDR electrical connections and able to carry both DDR and transactional protocols. This allows the system to be configured with varying numbers of DDR DRAM DIMMs 452 (e.g., DDR4 DIMMS) and PCM DIMMs 453 to achieve the desired capacity and/or performance points.

FIG. 4C illustrates a split architecture which hosts the near memory 403-406 acting as a memory side cache (MSC) on the CPU package 401 (either on the processor die or on a separate die). High bandwidth links 407 on the CPU package are used to interconnect a single or multiple DRAM devices 403-406 to the processor 310 which hosts the memory controller 331 and the MSC controller 124, as defined by the split architecture. NVRAM such as PCM memory devices reside on PCI Express cards or risers 455 that use PCI Express electrical connections and PCI Express protocol or a different transactional protocol over the PCI Express bus 454. The PCM devices on the PCI Express cards or risers 455 provide the far memory capacity of this split architecture.

FIG. 4D is a split architecture which uses DDR DRAM-based DIMMs 452 and DDR channels 440 to form the near memory which acts as an MSC. The processor 310 hosts the memory controller 331 and MSC controller 124. NVRAM such as PCM memory devices 455 reside on PCI Express cards or risers that use PCI Express electrical connections and PCI Express protocol or a different transactional protocol over the PCI Express link 454. The PCM devices on the PCI Express cards or risers 455 provide the far memory capacity of this split architecture, with the memory channel interfaces off the CPU package 401 providing multiple DDR channels 440 for DDR DRAM DIMMs 452.

FIG. 4E illustrates a unified architecture which hosts both near memory acting as an MSC and far memory NVRAM such as PCM on PCI Express cards or risers 456 that use PCI Express electrical connections and PCI Express protocol or a different transactional protocol over the PCI Express bus 454. The processor 310 hosts the integrated memory controller 331 but, in this unified architecture case, the MSC controller 124 resides on the card or riser 456, along with the DRAM near memory and NVRAM far memory.

FIG. 4F illustrates a unified architecture which hosts both the near memory acting as an MSC and the far memory NVRAM such as PCM, on DIMMs 458 using DDR channels 457. The near memory in this unified architecture comprises DRAM on each DIMM 458, acting as the memory side cache to the PCM devices on that same DIMM 458, that form the far memory of that particular DIMM. The MSC controller 124 resides on each DIMM 458, along with the near and far memory. In this embodiment, multiple memory channels of a DDR bus 457 are provided off the CPU package. The DDR bus 457 of this embodiment implements a transactional protocol over DDR electrical connections.

FIG. 4G illustrates a hybrid split architecture, whereby the MSC controller 124 resides on the processor 310 and both near memory and far memory interfaces share the same DDR bus 410. This configuration uses DRAM-based DDR DIMMs 411a as near memory acting as an MSC with the PCM-Based DIMMs 411b (i.e., far memory) residing on the same memory channel of the DDR bus 410, using DDR slots and NVRAM (such as PCM memory devices). The memory channels of this embodiment carry both DDR and transactional protocols simultaneously to address the near memory and far memory DIMMs, 411a and 411b, respectively.

FIG. 4H illustrates a unified architecture in which the near memory 461a acting as a memory side cache resides on a mezzanine or riser 461, in the form of DRAM-based DDR DIMMs. The memory side cache (MSC) controller 124 is located in the riser's DDR and PCM controller 460 which may have two or more memory channels connecting to DDR DIMM channels 470 on the mezzanine/riser 461 and interconnecting to the CPU over high performance interconnect(s) 462 such as a differential memory link. The associated far memory 461b sits on the same mezzanine/riser 461 and is formed by DIMMs that use DDR channels 470 and are populated with NVRAM (such as PCM devices).

FIG. 4I illustrates a unified architecture that can be used as memory capacity expansion to a DDR memory subsystem and DIMMs 464 connected to the CPU package 401 on its DDR memory subsystem, over a DDR bus 471. For the additional NVM-based capacity in this configuration, the near memory acting as a MSC resides on a mezzanine or riser 463, in the form of DRAM based DDR DIMMs 463a. The MSC controller 124 is located in the riser's DDR and PCM controller 460 which may have two or more memory channels connecting to DDR DIMM channels 470 on the mezzanine/riser and interconnecting to the CPU over high performance interconnect(s) 462 such as a differential memory link. The associated far memory 463b sits on the same mezzanine/riser 463 and is formed by DIMMs 463b that use DDR channels 470 and are populated with NVRAM (such as PCM devices).

FIG. 4J is a unified architecture in which a near memory acting as a memory side cache (MSC) resides on each and every DIMM 465, in the form of DRAM. The DIMMs 465 are on a high performance interconnect/channel(s) 462, such as a differential memory link, coupling the CPU package 401 with the MSC controller 124 located on the DIMMs. The associated far memory sits on the same DIMMs 465 and is formed by NVRAM (such as PCM devices).

FIG. 4K illustrates a unified architecture in which the near memory acting as a MSC resides on every DIMM 466, in the form of DRAM. The DIMMs are on high performance interconnect(s) 470 connecting to the CPU package 401 with the MSC controller 124 located on the DIMMs. The associated far memory sits on the same DIMM 466 and is formed by NVRAM (such as PCM devices).

FIG. 4L illustrates a split architecture which uses DDR DRAM-based DIMMs 464 on a DDR bus 471 to form the necessary near memory which acts as a MSC. The processor 310 hosts the integrated memory controller 331 and memory side cache controller 124. NVRAM such as PCM memory forms the far memory which resides on cards or risers 467 that use high performance interconnects 468 communicating to the CPU package 401 using a transactional protocol. The cards or risers 467 hosting the far memory host a single buffer/controller that can control multiple PCM-based memories or multiple PCM-based DIMMs connected on that riser.

FIG. 4M illustrates a unified architecture which may use DRAM on a card or riser 469 to form the necessary near memory which acts as a MSC. NVRAM such as PCM memory devices form the far memory which also resides on the cards or risers 469 that use high performance interconnects 468 to the CPU package 401. The cards or risers 469 hosting the far memory hosts a single buffer/controller that can control multiple PCM-based devices or multiple PCM based DIMMs on that riser 469 and also integrates the memory side cache controller 124.

In some of the embodiments described above, such as that illustrated in FIG. 4G, the DRAM DIMMS 411a and PCM-based DIMMS 411b reside on the same memory channel. Consequently the same set of address/control and data lines are used to connect the CPU to both the DRAM and PCM memories. In order to reduce the amount of data traffic through the CPU mesh interconnect, in one embodiment, a DDR DIMM on a common memory channel with a PCM-based DIMM is configured to act as the sole MSC for data stored in the PCM-based DIMM. In such a configuration, the far memory data stored in the PCM-based DIMM is only cached in the DDR DIMM near memory within the same memory channel, thereby localizing memory transactions to that particular memory channel.

Additionally, to implement the above embodiment, the system address space may be logically subdivided between the different memory channels. For example, if there are four memory channels, then ¼ of the system address space may be allocated to each memory channel. If each memory channel is provided with one PCMS-based DIMM and one DDR DIMM, the DDR DIMM may be configured to act as the MSC for that ¼ portion of the system address space.

The choice of system memory and mass storage devices may depend on the type of electronic platforms on which embodiments of the invention are employed. For example, in a personal computer, tablet computer, notebook computer, smartphone, mobile phone, feature phone, personal digital assistant (PDA), portable media player, portable gaming device, gaming console, digital camera, switch, hub, router, set-top box, digital video recorder, or other devices that have relatively small mass storage requirements, the mass storage may be implemented using NVRAM mass storage 152A alone, or using NVRAM mass storage 152A in combination with a flash/magnetic/optical mass storage 152B. In other electronic platforms that have relatively large mass storage requirements (e.g., large-scale servers), the mass storage may be implemented using magnetic storage (e.g., hard drives) or any combination of magnetic storage, optical storage, holographic storage, mass-storage flash memory, and NVRAM mass storage 152A. In such a case, system hardware and/or software responsible for storage may implement various intelligent persistent storage allocation techniques to allocate blocks of persistent program code and data between the FM 151B/NVRAM storage 152A and a flash/magnetic/optical mass storage 152B in an efficient or otherwise useful manner.

For example, in one embodiment a high powered server is configured with a near memory (e.g., DRAM), a PCMS device, and a magnetic mass storage device for large amounts of persistent storage. In one embodiment, a notebook computer is configured with a near memory and a PCMS device which performs the role of both a far memory and a mass storage device (i.e., which is logically partitioned to perform these roles as shown in FIG. 3). One embodiment of a home or office desktop computer is configured similarly to a notebook computer, but may also include one or more magnetic storage devices to provide large amounts of persistent storage capabilities.

One embodiment of a tablet computer or cellular telephony device is configured with PCMS memory but potentially no near memory and no additional mass storage (for cost/power savings). However, the tablet/telephone may be configured with a removable mass storage device such as a flash or PCMS memory stick.

Various other types of devices may be configured as described above. For example, portable media players and/or personal digital assistants (PDAs) may be configured in a manner similar to tablets/telephones described above, gaming consoles may be configured in a similar manner to desktops or laptops. Other devices which may be similarly configured include digital cameras, routers, set-top boxes, digital video recorders, televisions, and automobiles.

Efficient PCMS Refresh Mechanism

A "cell" or "memory cell" is understood to be a storage circuit capable of storing a single bit. A specific PCMS memory address typically invokes multiple cells to effect reads/writes from/to PCMS memory in the form of multi-bit "words". For example, if a 64 bit word is accessed with a single address, the address invokes 64 different memory cells. PCMS memory cells need to be refreshed in order to maintain their data. Presently, a PCMS cell in the '1' state is refreshed simply by reading it, whereas, a PCMS cell in the '0' state is refreshed by writing the cell to the '1' state (the cell is then re-written back to the '0' state so it keeps correct data).

Figure 5:
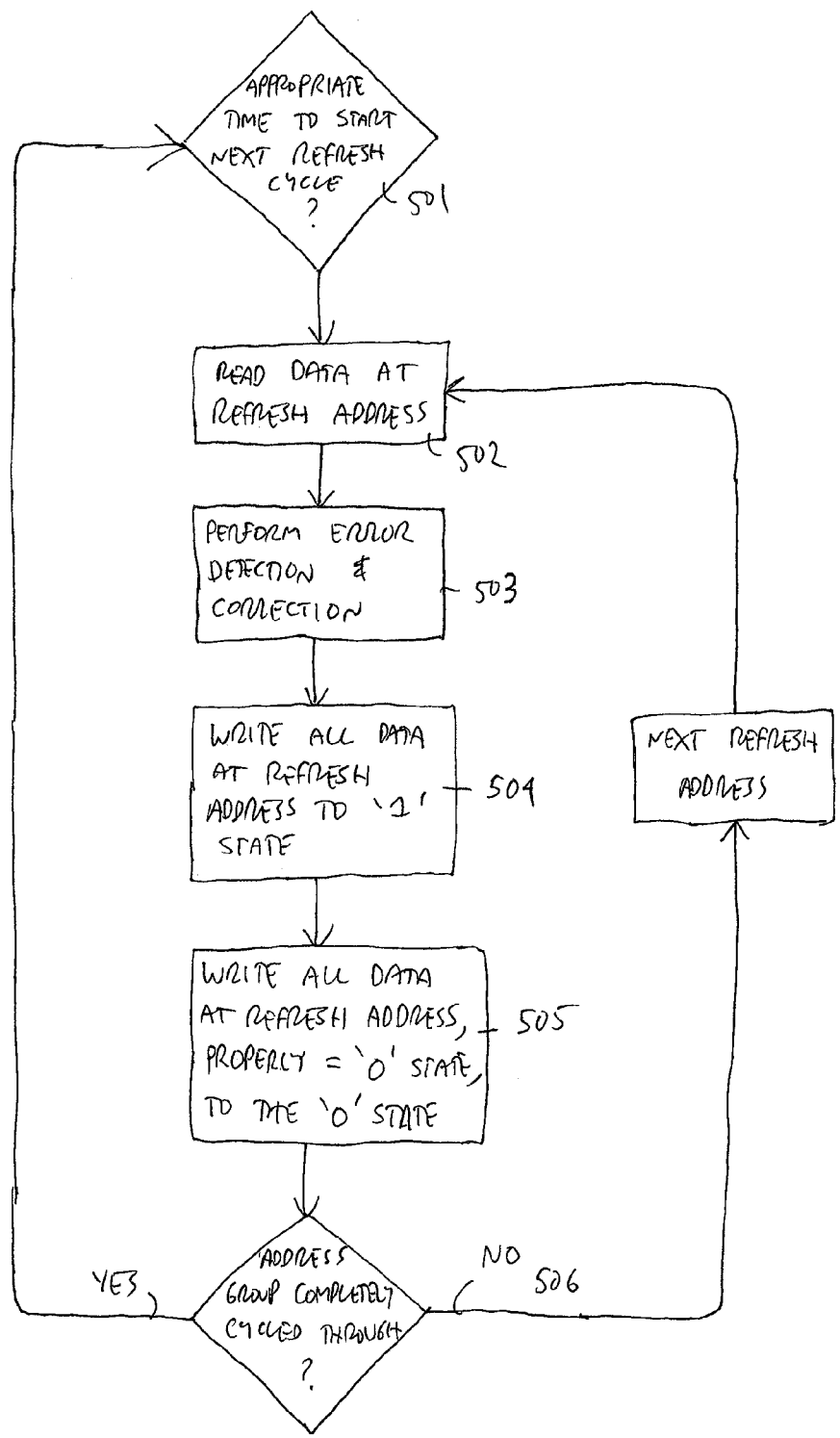
FIG. 5 shows a prior art PCMS device refresh methodology.

FIG. 5 shows an example of a prior art PCMS refresh cycling method for a PCMS memory. According to the methodology observed in FIG. 5, at an appropriate refresh time, a next refresh cycle is initiated for the memory cells associated with a group of addresses 501. The appropriate refresh time at which a next refresh cycle is commenced may be based, for example, on the elapse of a set period of time (periodic refreshing), the observation that an address in the address group has not been accessed for a pre established period of time (as needed refreshing), etc.

The refresh operation for the first address in the address group consists of reading data 502 at the address (which will read the data from each of the cells associated with the address's data word), performing error detection and correction 503 on the data, and, writing all of the address's cell to the "1" state 504. As a final step, the cells of those bits that were understood from the ECC process 503 to be in the "0" state are then written into the "0" state 505. This process is repeated 506 for each address in the address group until all addresses within the address group have had their corresponding cells refreshed 507 at which point a refresh cycle for the address group (or simply, "a refresh cycle") is completed.

Figure 6:
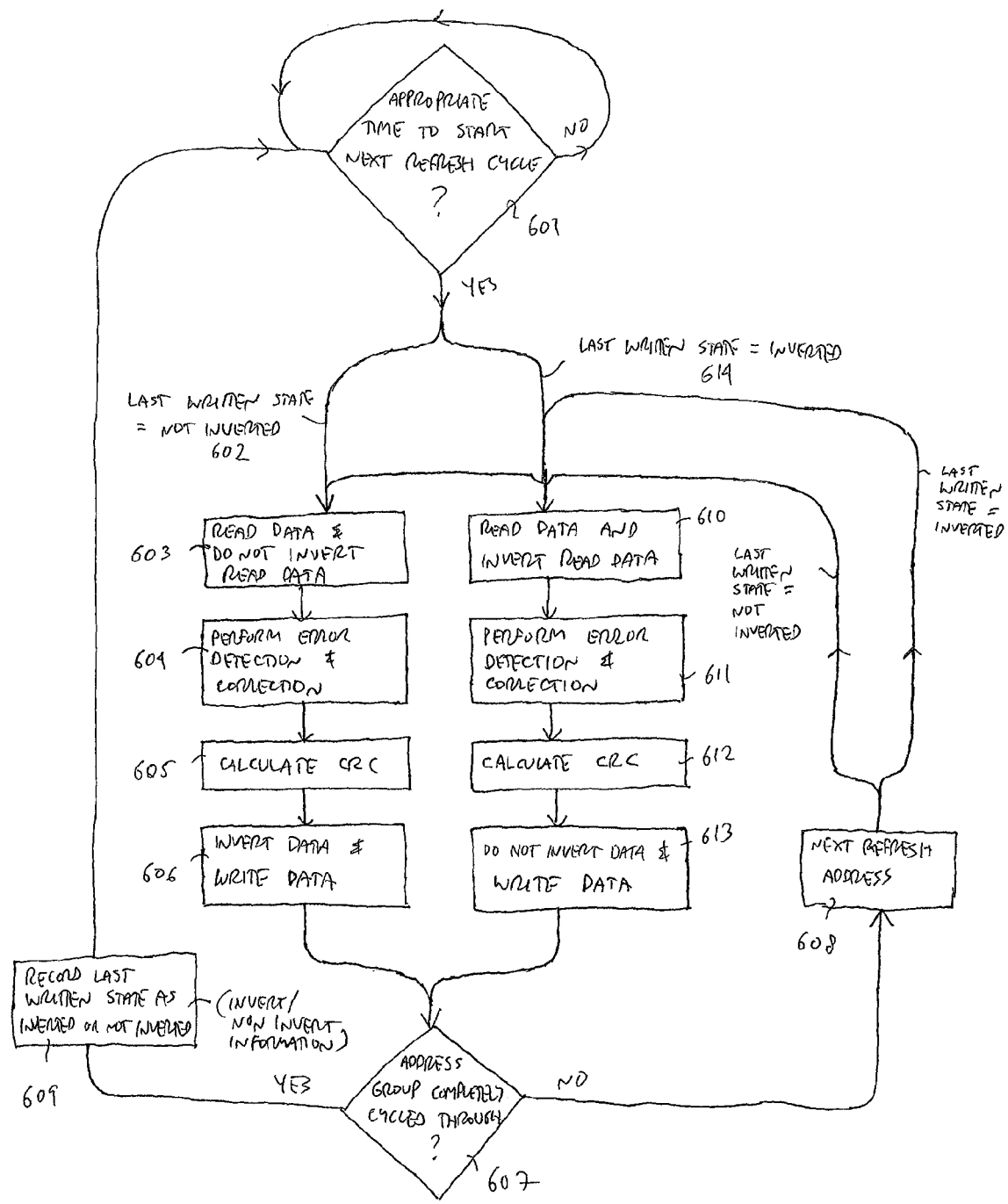
FIG. 6 shows an improved PCMS device refresh methodology.

FIG. 6 shows an improved PCMS refresh cycling methodology. Like the process of FIG. 5, at an appropriate refresh time, a next refresh cycle is initiated for the memory cells associated with a group of addresses 601. Again, the appropriate refresh time at which a next refresh cycle is commenced may be based, for example, on the elapse of a set period of time (periodic refreshing), the observation that an address in the address group has not been accessed for a pre established period of time (as needed refreshing), etc.

Assume for the sake of example that data for the address group is stored in PCMS memory in non-inverted form (that is, the data as stored in memory is logically correct) 602. As such, the refresh operation for the first address in the address group consists of reading a data word at the address and not inverting the read data 603, and performing error detection and correction 604 on the just read data word. A CRC value is then calculated for the data word. The data word and CRC value is then logically inverted and written back into PCMS memory 606. Here, the inversion 605 and write back 606 results in the data being stored in PCMS memory in an inverted state. Whether data words are stored in PCMS memory in an inverted state or non-inverted state is kept track of by the NVRAM controller as described more fully below.

Note the improvement in the overall time expended to refresh the address's memory cells as compared to the prior art process of FIG. 5. Specifically, in the prior art process of FIG. 5, data cells that are storing a logical 0 are accessed three times (read 502; written over with a "1" 504; and, written over again with a "0" 505). By contrast, as observed in the process of FIG. 6, all of the data cells targeted by the refresh address—including cells that are storing a "0"—are accessed only twice by way of: i) the read step 603; and, ii) the write-back with inverted data 606. Notably, cells storing a "1" are properly refreshed (read step 602), and, cells storing a "0" are properly refreshed (the inversion step 605 inverts the logical "0" to a "1" and the "1" is written into the cell 606).

The process 603-606 for data last written in non inverted form 602 then repeats for each address in the address group 607, 608 until all the addresses in the address group are refreshed (i.e., the refresh cycle is complete) 607. When the refresh cycle is complete, the NVRAM controller records that the data for the address group has been written in an inverted state 609 and waits for the next appropriate time to refresh the data 601. At the appropriate next refresh time 601, a different sequence of steps 610-613 is performed owing to the difference in the form of the data stored in PCMS memory between the two refresh cycles. Specifically, recalling that the data was originally stored in a non inverted form 603 before the just executed refresh cycle—the inversion at step 606 caused all data to be stored in inverted form for the next, upcoming refresh cycle. As such, steps 610-613 apply when the last written state is inverted 614.

Referring to FIG. 6, at step 610, the data word for the first address in the address group is read from memory 602. Here, because the data word is stored in PCMS memory in inverted form 614, the read data is inverted prior to performing error detection and correction 611 (so error detection and recovery can take place on "logically correct" data). After the error detection and correction is performed 611, CRC information is calculated 612 for the data. The data (and CRC) is then written back to memory 613 without any inversion step. Therefore, this time through the refresh cycle, the data is written back to PCMS memory in non-inverted form rather than inverted form (as in the previous refresh cycle).

The refresh process described just above 610-613 then repeats for each address in the address group until all the addresses in the address group are refreshed 607, 608. In this case, the NVRAM controller records the data as being written in the non inverted state 609 and refreshing is complete for the next group of addresses until the next appropriate time for a refresh cycle 601. From the above discussion of the two consecutive refresh cycles note that the last written state information 609 toggles back and forth between inverted and non inverted across consecutive refresh cycles.

It is worthwhile to note that proper refreshing for the process 610-613 is accomplished for essentially the same reasons as described above. That is, even though initially stored as logically inverted from its correct data content 614, the read step 610 of logically inverted data stored as a "1" still refreshes the data, and, likewise, the inversion 610 and write step 613 of logically inverted data originally stored as a "0" results in such data be written over with a (logically correct) "1" which, again, refreshes the data being stored.

As memory accesses are expensive time-wise, the elimination of the extra access for cells storing a logical "0" (i.e., the elimination of the write-back step 505 of FIG. 5), corresponds to a significant decrease in the time spent refreshing PCMS cells, which, in turn, should correspond to a significant improvement in the performance of the PCMS memory device (since time previously spent on refreshing can now be used instead to service actual read/write commands for the memory's corresponding computer system). The extra step of inverting the data is considered negligible as it can typically be performed in a single clock cycle whereas the eliminated third memory access typically consumes multiple clock cycles.

A recognizable "cost" of removing the third access, however, is the writing of data back to PCMS memory in inverted form every other refresh cycle. In order to properly reconstruct data for system use (e.g., providing read data requested by a CPU or I/O device), the NVRAM controller, as described above, keeps track of whether data is kept in PCMS memory in inverted form or non-inverted form. More details on embodiments as to how such tracking may be implemented are provided further below.

Figure 7:
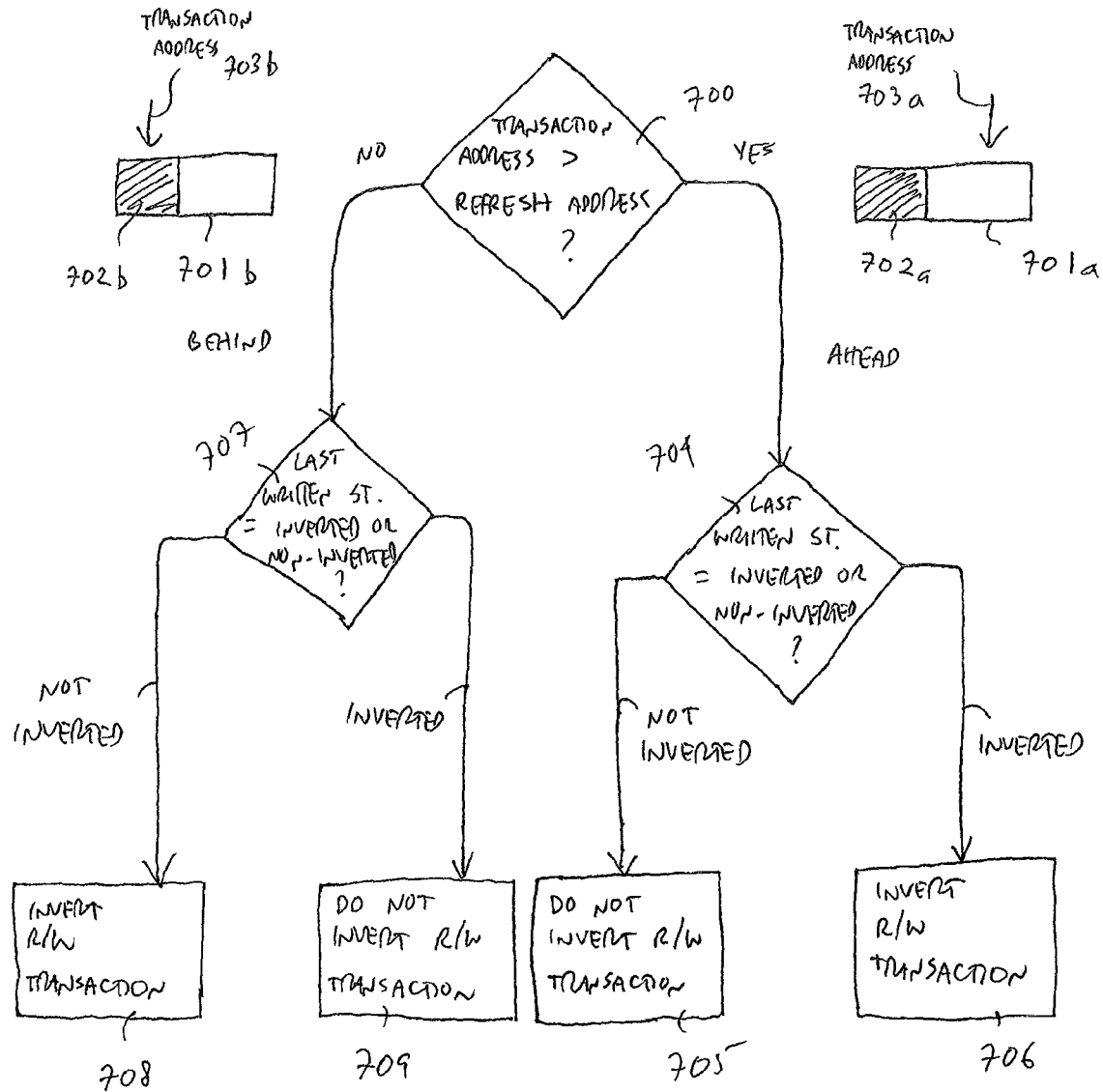
FIG. 7 shows an aspect of an improved PCMS device refresh approach.

FIG. 7 shows a transactional access methodology that is performed by the NVRAM controller so that substantive transactions with the PCMS memory (e.g., reads/writes from/to PCMS memory responsive to requests made by a CPU or I/O device) can be successfully performed in conjunction with the refresh process described just above.

Here, it is pertinent for the NVRAM controller to understand, for a read transaction, whether the data read from PCMS is inverted or not. Likewise, for a write transaction, it is pertinent for the NVRAM controller to understand whether the data should be written in an inverted format or in a non inverted format.

FIG. 7 shows a generic flow diagram suitable for determining whether transactional data is to be inverted or not. Also, at least for systems where address groups are handled, the flow diagram of FIG. 7 is suitable for both reads from PCMS memory and writes to PCMS memory. As one embodiment of an address group corresponds to sequentially increasing addresses over an address range (e.g., next refresh address=current refresh address+1), an initial inquiry is made to see if the address targeted by the transaction is "ahead of" the current refresh cycle, or, "behind" the current refresh cycle 700.

If the address targeted by the transaction is "ahead of" the current refresh cycle, the address has not yet been refreshed by the current refresh cycle. If the address targeted by the transaction is "behind" the current refresh cycle, the address has been refreshed by the current refresh cycle. Viewing the set of addresses in an address group as a horizontal block 701*a,b*, according to one approach, address values are increasing from left to right and the refresh cycle is advanced through the address group by incrementing the address value of the "just refreshed" address (e.g., by +1). As such, viewing the respective shaded regions 702*a,b* of blocks 701*a,b* as those addresses of the address group that have been refreshed in the current refresh cycle, continued refreshment of remaining addresses over the course of the refresh cycle will have the effect of gradually progressing the right edge of each of the shaded regions 702*a,b* to the right.

By comparing the specific address that is currently being refreshed ("refresh address") with the address targeted by the transaction ("transaction address"), a determination can be made whether the transaction address is ahead of or behind the refresh address 700. Specifically, if the transaction address is greater than the refresh address, the transaction address is ahead of the refresh cycle. Likewise, if the transaction address is less than the refresh address the transaction address is behind the refresh cycle. The former situation is observed with address block 701*b* (where the transaction address is represented by pointer 703*b*). The later situation is represented is observed with address block 701*a* (where the address is represented by pointer 703*a*).

If the transaction address is ahead of the refresh cycle, the NVRAM controller treats the data of the transaction according to the logic of the state that the data was written to by the refresh cycle prior to the current refresh cycle. For example, if the inversion being performed by the current refresh cycle is causing data to be stored in an inverted state, then, the prior refresh cycle stored the data in the non inverted state. Therefore, the NVRAM controller will not invert the transaction's data 704, 705. That is, in the case of a read transaction, the NVRAM controller will not invert the read data after it is read from PCMS memory, or, in the case of a write transaction, the NVRAM controller will not invert the write data before it is written to PCMS memory. Alternatively, if the inversion being performed by the current refresh cycle is causing data to be stored in a non inverted state, the prior refresh cycle caused data to be stored in an inverted state. In this case, the NVRAM controller will invert the transaction's data 704, 706. That is, in the case of a read transaction, the NVRAM controller will invert the read data after it is read from PCMS memory, or, in the case of a write transaction, the NVRAM controller will invert the write data before it is written to PCMS memory.

By contrast, if the transaction is behind the refresh cycle, the NVRAM controller treats the data of the transaction according to the logic of the state that the data is being written to in the current refresh cycle. For example, if the inversion being performed by the current refresh cycle is causing data to be stored in an inverted state, then, the NVRAM controller will invert the transaction's data 707, 708. That is, in the case of a read transaction, the NVRAM controller will invert the read data after it is read from PCMS memory, or, in the case of a write transaction, the NVRAM controller will invert the write data before it is written to PCMS memory. Alternatively, if the inversion being performed by the current refresh cycle is causing data to be stored in a non inverted state, the NVRAM controller will not invert the transaction's data 707, 709. That is, in the case of a read transaction, the NVRAM controller will not invert the read data after it is read from PCMS memory, or, in the case of a write transaction, the NVRAM controller will not invert the write data before it is written to PCMS memory.

Notably, the logic of the above described decision tree involves recognition of the logic state that the current refresh cycle is writing data in, and/or, the logic state that the immediately prior refresh cycle wrote data in. FIG. 7 depicts an embodiment where the state that the immediately prior refresh cycle wrote data in is kept track of ("last written state") 704, 707. Alternate embodiments may use the logic state of the current refresh cycle or a combination of both current and immediately prior logic states (e.g., the current logic state is used for step 707 and the previous logic state is used for step 704). Also, if a transaction is received (read or write) in between refresh cycles of an address group, the transaction is effected for the logic state that the most recently completed refresh cycle wrote data in. For example, if the inversion step of the most recently completed refresh cycle caused data to be written for all addresses in the address group in inverted form, the NVRAM controller will invert read transaction data or invert write transaction data.

Figure 8:
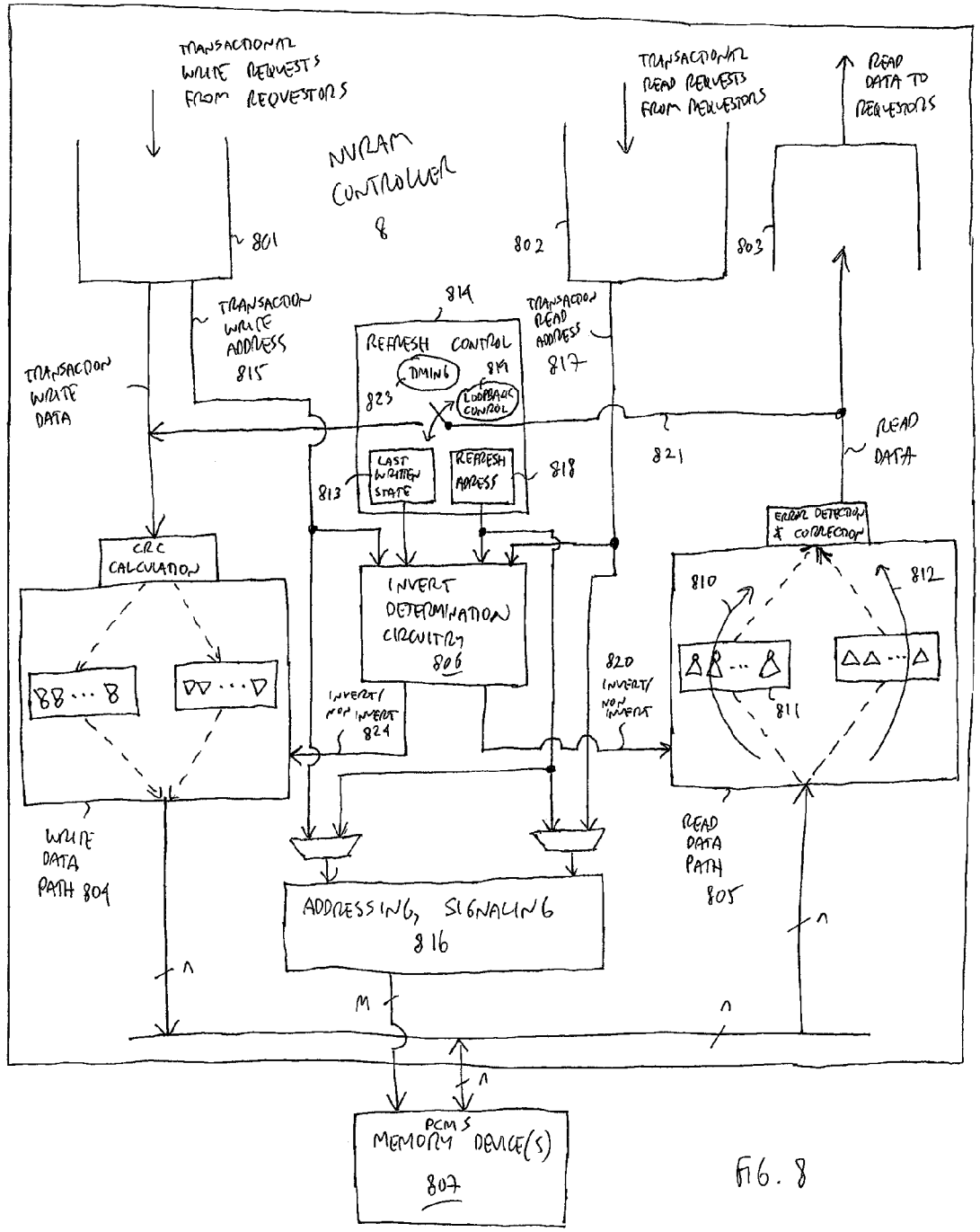
FIG. 8 shows an embodiment of an NVRAM controller architecture that can implement the improved PCMS device refresh approach.

FIG. 8 shows an embodiment of an NVRAM controller architecture that operates according to the methodologies described above. As observed in FIG. 8, the NVRAM controller architecture includes queues 801, 802, 803 to respectively queue write transaction requests (where each write transaction request includes a write address and write data), read transaction requests (where each read transaction request includes a read address) and read data (which includes data read from PCMS memory for previously processed read requests).

Both the write data path 804 and the read data path 805 include a selectable inverted path and a non inverted path to effect data inversion as described above under the control of invert determination circuitry 806. Here, for a particular access to PCMS memory 807, whether for a read access or a write access, and, whether for a transaction or a refresh, invert determination logic circuitry 808 determines whether the data is to be inverted or not inverted.

In the case of a read, again either for a read transaction or as part of a refresh, if the data is to be inverted, the invert determination circuitry 806 sends a control signal 820 to the read data path 804, which, in turn, enables a path 810 that flows through a read path inversion logic bank 811. If the read data is not to be inverted, the invert determination circuitry 808 instead sends a control signal to the read data path 804, which, in turn, enables an alternate path 812 that does not flow through the read inversion logic bank 811. Likewise, in the case of a write, either for a write transaction or as part of a refresh, if the data is to be inverted, the invert determination circuitry 808 sends a control signal to the write data path 805, which, in turn, enables a path 810 that flows through a read path inversion logic bank 811. If the read data is not to be inverted, the invert determination circuitry 806 instead sends a control signal 820 to the read data path 804, which, in turn, enables an alternate path 812 that does not flow through the read inversion logic bank 811. A similar control signal 824 exists to effect non inverted writes and inverted writes for the write data path 804

As discussed above, the proper logic state of a refresh read or write access (or a transactional read or write access that occurs between refresh cycles) can be determined from the logic state of the immediately prior refresh cycle. As observed in FIG. 8, the logic state of the immediately prior refresh cycle ("last written state") is kept in a register 813 associated with refresh control logic circuitry 814. Invert determination circuitry 806 therefore has an input that is coupled to register 813. Also, again as discussed above, the proper inverted or non inverted logic state of a transactional read or write that takes place while a refresh cycle is on-going can be determined from: i) the transaction address; ii) the current refresh address; and, iii) the logic state of the immediately prior refresh cycle.

As can be seen from FIG. 8, a write address bus 815 that carries the address of a write transaction is routed to both PCMS addressing, signaling circuitry 816 and an input of the invert determination circuitry 806. The PCMS addressing and signaling circuitry 816 uses the write address to effect a write operation to the correct PCMS memory address location. The invert determination circuitry 806 will use the write address to determine whether the write data is to be inverted or not in the case where the transactional write is targeted to an address that is within an address group currently undergoing a refreshing cycle.

Similarly, a read address bus 817 that carries the address of a read transaction is routed to both PCMS addressing, signaling circuitry 816 and an input of the invert determination circuitry 806. The PCMS addressing and signaling circuitry 816 uses the read address to effect a read operation to the correct PCMS memory address location. The invert determination circuitry 806 will use the read address to determine whether the read data is to be inverted or not in the case where the transactional read is targeted to an address that is within an address group currently undergoing a refreshing cycle. Refresh or transaction addresses are multiplexed into the addressing and signaling circuitry for both reads and writes.

The invert determination circuitry 806 also has an input to receive the current refresh address (from a register 818 associated with the refresh control logic circuitry 814). As such, with receipt of the last written state from register 813, the transaction address from the appropriate address bus 815/817, and the current refresh address from register 818, the invert determination circuitry can determine whether the transactional data is to be inverted when the corresponding address is within an address group that is currently being refreshed.

The refresh control logic circuitry 814 contains the logic circuitry that controls the refresh operations. As discussed above, the refresh control logic circuitry 814 contains a register 813 that keeps the logic state (inverted or non inverted) that data was written in by the last completed refresh cycle (in alternate embodiments the logic state of the next refresh cycle may be kept or both values may be kept). In an embodiment, this information is toggled for an address group each time a refresh cycle for the address group is completed. Also as described above, the refresh time control circuitry 814 includes a register 818 that keeps track of the current refresh address.

Note that for simplicity a single last written state register 813 is shown. In a further embodiment, a last written state register (or similar register(s)) is instantiated for each address group that the refresh timing control circuit 814 is designed to support refreshment of. This may be a function of, for instance, the density of the PCMS devices that the NVRAM controller is designed to access and/or the number of PCMS devices that the NVRAM control is designed to support access to (e.g., the number of channels interfacing to the NVRAM controller and/or the number of DIMM cards that may be plugged into each channel, etc.).

The refresh control logic circuitry 814 also has logic circuitry 819 to control a "loopback" path 821 from the read channel to the write channel. Referring back to FIG. 6, note that each refresh for a particular refresh address includes a read followed by a write. The loopback path 821 effectively routes data read from memory 807 into the write data path 804 in order to implement this process sequence. The refresh control circuitry 814 also includes timing circuitry 823 to determine when a refresh cycle of an address group is appropriate.

The NVRAM controller circuitry discussed above may be implemented on a same card that the PCMS memory devices are implemented on (or as part of a same package having the PCMS memory devices) that is (or is to be) "plugged into" some kind of channel that is coupled to a memory controller/host side of a computing system. Alternatively, some of the circuitry discussed above (e.g., a portion of addressing and signaling logic 816 closer to the PCMS memory devices and the read and write data paths including associated CRC and error detection and correction circuitry) may be implemented on a same card or within a same package as the PCMS devices while a remaining portion of the circuitry discussed above may be implemented on a memory controller/host side of a computing system. Alternatively, all of the circuitry discussed above may be implemented on a memory controller/host side of a computing system.

Figure 9:
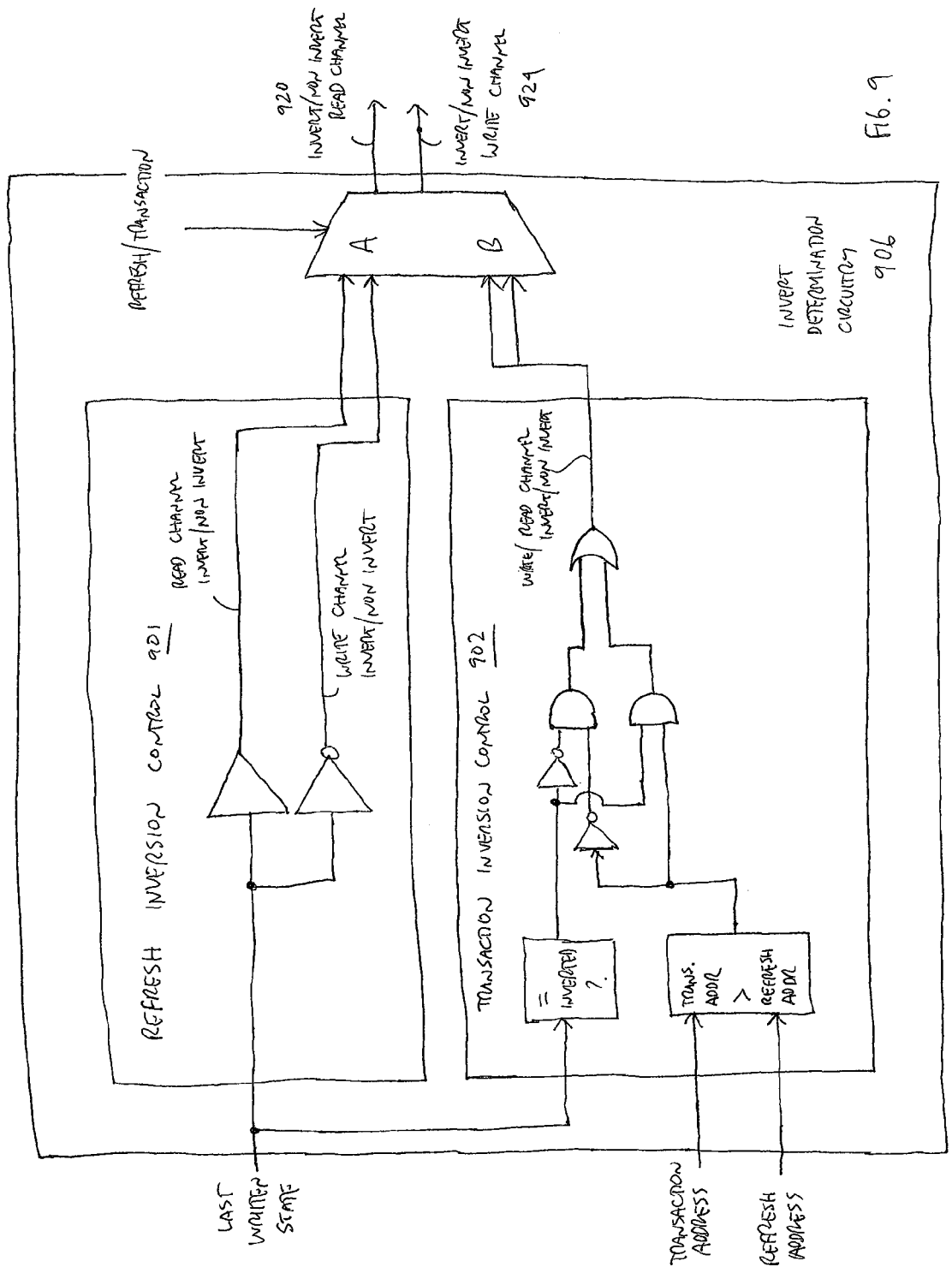
FIG. 9 shows an embodiment of invert determination circuitry.

FIG. 9 shows an embodiment of the inversion determination logic circuitry 906 designed to implement the methodologies observed in FIGS. 6 (refresh operation) and 7 (transactional read or write). Consistent with the methods observed in these figures, refresh inversion determination circuit 901 determines the invert/non-invert input to the read channel and the write channel for a refresh operation. For a refresh read, circuit 901 will signal inversion for a refresh read if the last written state was inverted, or, will signal no inversion for a refresh read if the last written state was not inverted. The write channel inversion signal for a refresh is just the logical opposite of the read channel inversion signal for a refresh.

Transaction inversion determination circuitry 902 will signal, regardless if the transaction is a read or a write, inversion if: i) the transaction address is ahead of the current refresh address and the last written state was inverted; or, ii) the transaction address is behind the refresh address and the last written state was not inverted. Otherwise non-inversion is signaled.

Figure 10:
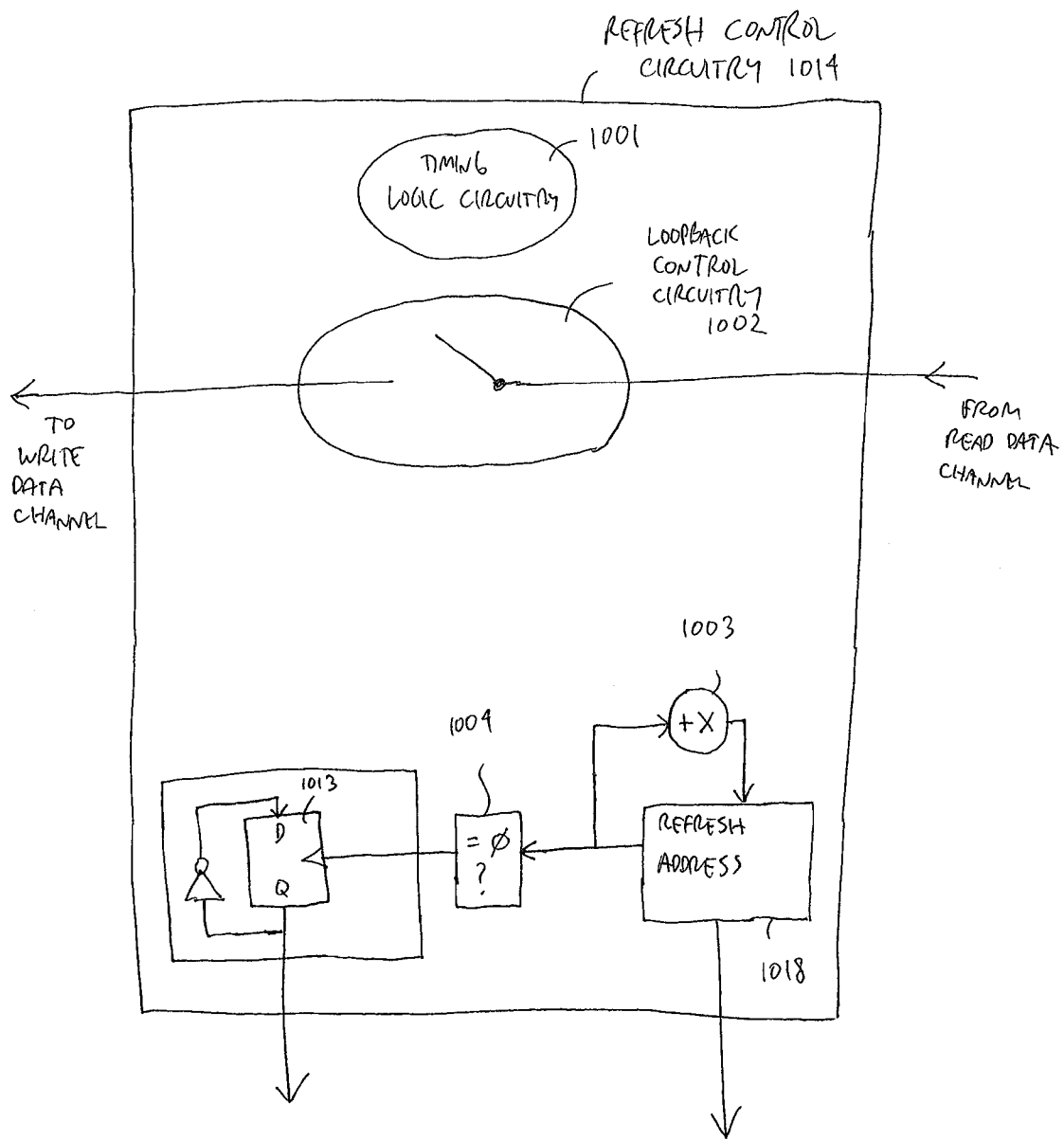
FIG. 10 shows an embodiment of refresh control circuitry.

FIG. 10 shows an embodiment of the refresh control circuitry. As observed in FIG. 10, the refresh control circuitry includes timing circuitry 1001 to determine when a refresh cycle is appropriate for a particular group of addresses. The refresh control circuitry also includes circuitry 1002 to enable the loopback from the read channel to the write channel.

The refresh control circuitry also includes a last written state register 1013 and a current refresh address register 1018. These registers have already been described above. Essentially, the last written state register 1013 indicates whether the last fully complete refresh cycle for a group of addresses wrote data into PCMS memory in the inverted state or the non inverted state. The current refresh address register 1018 indicates the address in an active refresh cycle being refreshed. Circuitry 1003 increments the current refresh address to the next refresh address value. Other algorithms besides offset addition to determine a next refresh address are possible. Comparator 1004 determines if the refresh cycle has been completed. For simplicity, circuitry 1004 is shown to indicate that the refresh cycle is complete whenever the current refresh address rolls over to a value of 000 . . . 0. When the refresh cycle is deemed complete, the value of the last written state register 1013 is toggled.

What is claimed is:

1. An apparatus, comprising:
   invert determination logic circuitry to determine if a read data path that transports data read from a memory device is to be inverted or not inverted as a function of whether information represented by said data was last written in an inverted or non inverted logical state to said memory device during a refresh of said memory device, said memory device comprising vertically stacked storage cell arrays.

2. The apparatus of claim 1 wherein said read data path comprises a first selectable path having a bank of inverters to invert data read from said memory device, and, a second selectable path that does not invert data read from said memory device, said invert determination logic circuitry to provide a signal that establishes which one of said selectable paths is selected.

3. The apparatus of claim 2 further comprising refresh control logic circuitry having circuitry to determine when a next refresh cycle of a group of addresses of said memory device are to be refreshed.

4. The apparatus of claim 1 wherein said invert determination logic circuitry has first logic circuitry to determine if said read data path is to be inverted for a refresh, and, has second logic circuitry to determine if said read data path is to be inverted for a read or write transaction.

5. The apparatus of claim 1 further comprising a register that is indicative of whether said data was last written in an inverted or non inverted state to said memory device during said refresh of said memory device.

6. The apparatus of claim 1 further comprising refresh control logic circuitry to enable, during said refresh of said memory device, a loopback from said read data path to a write data path that transports write data to be written to said device.

7. The apparatus of claim 6 wherein said write data path comprises a first selectable path having a bank of inverters to invert data to be written to said memory device, and, a second selectable path that does not invert data to be written to said memory device, said invert determination circuitry to ensure that one but not both of said data paths inverts its respective data during said refresh of said memory device.

8. A method, comprising:
   reading data from a memory device, the memory device comprising vertically stacked storage cell arrays;
   inverting said data to form inverted data;
   writing said inverted data into said memory device at a same address that said data was read from; and,
   recording invert/non-invert information that indicates whether said inverted data represents an inverted form or non inverted form of information stored at said same address.

9. The method of claim 8 further comprising determining that a next refresh is appropriate.

10. The method of claim 9, further comprising, as a consequence of said determining:
    reading said inverted data from said memory device from said same address;
    inverting said inverted data to form twice inverted data;
    writing said twice inverted twice into said memory device at said address; and,
    toggling said invert/non-invert information and recording the result.

11. The method of claim 9 further comprising:
    a) reading said inverted data and referring to said invert/non-invert information;
    b) inverting said inverted data if said invert/non-invert information indicates said inverted data represents an inverted form of said information, or, not inverting said inverted data if said invert/non-invert information indicates said inverted data represents a non inverted form of said information;
    c) writing a resultant of b) into said memory device at said same address if b) included inverting said inverted data, or, writing an inverted form of a resultant of b) into said memory device at said same address if b) included not inverting said inverted data.

12. The method of claim 11 further comprising, after b) but before c), performing error detection and recovery followed by a CRC calculation on information produced by b) to form said resultant of b).

13. The method of claim 8 further comprising:
    receiving a read transaction for said same address;
    comparing said same address to an address of a refresh cycle;
    referring to said invert/non-invert information; and,
    performing a second read of said memory device at said same address to satisfy said read transaction and performing one of the following:
    i) inverting data received from said second read if said invert/non-invert information indicated said inverted data represents an inverted form of said information and said same address is behind said refresh cycle;
    ii) inverting data received from said second read if said invert/non-invert information indicated said inverted data represents a non inverted form of said information and said same address is ahead of said refresh cycle;
    iii) not inverting data received from said second read if said invert/non-invert information indicated said inverted data represents a non inverted form of said information and said address is behind said refresh cycle;
    iv) not inverting data received from said second read if said invert/non-invert information indicated said inverted data represents an inverted form of said information and said address is ahead of said refresh cycle.

14. The method of claim 13 further comprising updating said invert/non-invert information when said refresh cycle is complete.

15. The method of claim 8 further comprising:
    receiving a write transaction with write data for said same address;
    comparing said same address to a current address of said refresh cycle;
    referring to said invert/non-invert information; and,
    satisfying said write transaction by performing one of the following:
    i) inverting said write data if said invert/non-invert information indicated said inverted data represents an inverted form of said information and said same address is behind of said refresh cycle;
    ii) inverting said write data if said invert/non-invert information indicated said inverted data represents a non inverted form of said information and said same address is ahead of said refresh cycle;
    iii) not inverting said write data if said invert/non-invert information indicated said inverted data represents a non inverted form of said information and said address is behind said refresh cycle;

iv) not inverting said write data if said invert/non-invert information indicated said inverted data represents an inverted form of said information and said address is ahead of said refresh cycle.

16. The method of claim 15 further comprising updating said invert/non-invert information when said refresh cycle is complete.

17. A computing system, comprising:
a near memory composed of a DRAM device;
a far memory composed of a memory device, the memory device comprising vertically stacked storage cell arrays;
an NVRAM controller coupled to said memory device, said NVRAM controller comprising invert determination logic circuitry to determine if a read data path that transports data read from said memory device is to be inverted or not inverted as a function of whether information represented by the data was last written in an inverted or non inverted logical state to said memory device during a refresh of said memory device.

18. The computing system of claim 17 wherein said read data path comprises a first selectable path having a bank of inverters to invert data read from said memory device, and, a second selectable path that does not invert data read from said memory device, said invert determination circuitry to provide a signal that establishes which one of said selectable paths is selected.

19. The computing system of claim 18 further comprising refresh control logic circuitry having circuitry to determine when a next refresh cycle of a group of addresses of said memory device are to be refreshed.

20. The computing system of claim 17 wherein said invert determination logic circuitry has first logic circuitry to determine if said read data path is to be inverted for a refresh, and, has second logic circuitry to determine if said read data path is to be inverted for a read or write transaction.

21. The computing system of claim 18 further comprising a register that is indicative of whether said data was last written in an inverted or non inverted state to said memory device during said refresh of said memory device.

22. The computing system of claim 17 further comprising refresh control logic circuitry to enable, during said refresh of said memory device, a loopback from said read data path to a write data path that transports write data to be written to said memory device.

* * * * *